(12) United States Patent
Suzuki

(10) Patent No.: US 7,880,966 B2
(45) Date of Patent: Feb. 1, 2011

(54) OPTICAL ARTICLE INCLUDING A LAYER SIOX AS MAIN COMPONENT AND MANUFACTURING METHOD OF THE SAME

(75) Inventor: Keiichi Suzuki, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 559 days.

(21) Appl. No.: 11/627,798

(22) Filed: Jan. 26, 2007

(65) Prior Publication Data
US 2010/0328605 A1    Dec. 30, 2010

(30) Foreign Application Priority Data

| Feb. 1, 2006 | (JP) | ............................. 2006-024161 |
| Feb. 1, 2006 | (JP) | ............................. 2006-024162 |
| Feb. 1, 2006 | (JP) | ............................. 2006-024170 |
| Oct. 6, 2006 | (JP) | ............................. 2006-275295 |

(51) Int. Cl.
*G02B 1/10*        (2006.01)
(52) U.S. Cl. ....................... 359/581; 359/586
(58) Field of Classification Search ........................ None
See application file for complete search history.

(56) References Cited

U.S. PATENT DOCUMENTS

| 4,609,267 A * | 9/1986 | Deguchi et al. ............. 351/163 |
| 5,242,740 A | 9/1993 | Rostaing et al. |
| 5,674,783 A | 10/1997 | Jang et al. |
| 6,664,177 B1 | 12/2003 | Lin et al. |
| 7,005,188 B2 | 2/2006 | Anderson et al. |
| 2001/0003606 A1 | 6/2001 | Kou et al. |
| 2006/0130891 A1 * | 6/2006 | Carlson ...................... 136/256 |
| 2008/0174876 A1 * | 7/2008 | Fukui et al. ................. 359/601 |

FOREIGN PATENT DOCUMENTS

| GB | 2 326 886 A | 1/1999 |
| JP | 03-084501 A | 4/1991 |
| JP | 05-214515 | 8/1993 |
| JP | 5-247242 A | 9/1993 |
| JP | 2002221601 A * | 8/2002 |
| JP | 2005-187936 | 7/2005 |
| KR | 2001-0074731 A | 8/2001 |

* cited by examiner

*Primary Examiner*—Arnel C Lavarias
(74) *Attorney, Agent, or Firm*—Sughrue Mion, PLLC

(57) ABSTRACT

An optical article including a layer that has SiOx as a main component and is formed on an optical substrate, directly or with at least one different layer interposed between the layer and the optical substrate, a surface of the layer, which is in the opposite side to the optical substrate, being nitrided.

5 Claims, 11 Drawing Sheets

| | SAMPLE No. | CONFIGURATION OF ANTI-REFLECTION LAYER | | | EVALUATION | GENERAL EVALUATION |
|---|---|---|---|---|---|---|
| | | NITRIDING METHOD | FILM FORMING MATERIAL | SiO₂ SUB-LAYER OF ANTI-REFLECTION LAYER (NITRIDING TREATMENT BEING OR NONE) | ABRASION RESISTANCE | |
| EMBODIMENT 1-1 | S1-1 | PLASMA | SiO₂/ZrO₂ | 1SUB-LAYER(BEING),3SUB-LAYER(BEING),5SUB-LAYER(BEING) | A | ◎ |
| EMBODIMENT 1-2 | S1-2 | PLASMA | SiO₂/ZrO₂ | 1SUB-LAYER(BEING),3SUB-LAYER(NONE),5SUB-LAYER(BEING) | A | ◎ |
| EMBODIMENT 1-3 | S1-3 | PLASMA | SiO₂/ZrO₂ | 1SUB-LAYER(NONE),3SUB-LAYER(BEING),5SUB-LAYER(BEING) | A | ◎ |
| EMBODIMENT 1-4 | S1-4 | PLASMA | SiO₂/ZrO₂ | 1SUB-LAYER(BEING),3SUB-LAYER(NONE),5SUB-LAYER(BEING) | A | ◎ |
| EMBODIMENT 1-5 | S1-5 | ION GUN | SiO₂/ZrO₂ | 1SUB-LAYER(BEING),3SUB-LAYER(BEING),5SUB-LAYER(BEING) | A | ◎ |
| EMBODIMENT 1-6 | S1-6 | PLASMA | SiO₂/TiO₂ | 1SUB-LAYER(BEING),3SUB-LAYER(BEING),5SUB-LAYER(BEING),7SUB-LAYER(BEING) | A | ◎ |
| COMPARATIVE EXAMPLE 1-1 | SR1-1 | — | SiO₂/ZrO₂ | 1SUB-LAYER(NONE),3SUB-LAYER(NONE),5SUB-LAYER(NONE) | D | × |
| COMPARATIVE EXAMPLE 1-2 | SR1-2 | — | SiO₂/TiO₂ | 1SUB-LAYER(NONE),3SUB-LAYER(NONE),5SUB-LAYER(NONE),7SUB-LAYER(NONE) | D | × |

FIG. 4

| | SAMPLE No. | ANTI-REFLECTION LAYER | | | ANTIFOULING LAYER |
|---|---|---|---|---|---|
| | | NITRIDING METHOD | FILM FORMING MATERIAL | SiO₂ SUB-LAYER (NITRIDING TREATMENT BEING OR NONE) | WATER REPELLENT |
| EMBODIMENT 2-1 | S 2-1 | PLASMA | SiO₂/ZrO₂ | 1SUB-LAYER(BEING),3SUB-LAYER(BEING), 5SUB-LAYER(NONE) | KY-130 |
| EMBODIMENT 2-2 | S 2-2 | PLASMA | SiO₂/ZrO₂ | 1SUB-LAYER(BEING),3SUB-LAYER(NONE), 5SUB-LAYER(NONE) | KY-130 |
| EMBODIMENT 2-3 | S 2-3 | PLASMA | SiO₂/ZrO₂ | 1SUB-LAYER(NONE),3SUB-LAYER(BEING), 5SUB-LAYER(NONE) | KY-130 |
| EMBODIMENT 2-4 | S 2-4 | ION GUN | SiO₂/ZrO₂ | 1SUB-LAYER(BEING),3SUB-LAYER(BEING), 5SUB-LAYER(NONE) | KY-130 |
| EMBODIMENT 2-5 | S 2-5 | PLASMA | SiO₂/ZrO₂ | 1SUB-LAYER(BEING),3SUB-LAYER(BEING), 5SUB-LAYER(NONE) | OPTOOL DSX |
| EMBODIMENT 2-6 | S 2-6 | PLASMA | SiO₂/TiO₂ | 1SUB-LAYER(BEING),3SUB-LAYER(BEING), 5SUB-LAYER(BEING),7SUB-LAYER(NONE) | KY-130 |
| EMBODIMENT 2-7 | S 2-7 | PLASMA | SiO₂/ZrO₂ | 1SUB-LAYER(NONE),3SUB-LAYER(NONE), 5SUB-LAYER(BEING) | KY-130 |
| EMBODIMENT 2-8 | S 2-8 | PLASMA | SiO₂/TiO₂ | 1SUB-LAYER(NONE),3SUB-LAYER(NONE), 5SUB-LAYER(NONE),7SUB-LAYER(BEING) | KY-130 |
| COMPARATIVE EXAMPLE 2-1 | S R 2-1 | — | SiO₂/ZrO₂ | 1SUB-LAYER(NONE),3SUB-LAYER(NONE), 5SUB-LAYER(NONE) | KY-130 |
| COMPARATIVE EXAMPLE 2-2 | S R 2-2 | — | SiO₂/TiO₂ | 1SUB-LAYER(NONE),3SUB-LAYER(NONE), 5SUB-LAYER(NONE),7SUB-LAYER(NONE) | KY-130 |

FIG. 8A

| | EVALUATION | | | | | GENERAL EVALUATION |
|---|---|---|---|---|---|---|
| | ABRASION RESISTANCE | WIPE DURABILITY | | | | |
| | | INITIAL | | AFTER TEST | | |
| | | CONTACT ANGLE (°) | INK WIPEABILITY | CONTACT ANGLE (°) | INK WIPEABILITY | |
| EMBODIMENT 2-1 | A | 108 | ○ | 103 | ○ | ◎ |
| EMBODIMENT 2-2 | B | 109 | ○ | 104 | ○ | ○ |
| EMBODIMENT 2-3 | B | 109 | ○ | 104 | ○ | ○ |
| EMBODIMENT 2-4 | A | 108 | ○ | 104 | ○ | ◎ |
| EMBODIMENT 2-5 | A | 109 | ○ | 103 | ○ | ◎ |
| EMBODIMENT 2-6 | A | 109 | ○ | 103 | ○ | ◎ |
| EMBODIMENT 2-7 | A | 107 | ○ | 70 | × | ○ |
| EMBODIMENT 2-8 | A | 108 | ○ | 73 | × | ○ |
| COMPARATIVE EXAMPLE 2-1 | D | 108 | ○ | 103 | ○ | × |
| COMPARATIVE EXAMPLE 2-2 | D | 109 | ○ | 102 | ○ | × |

FIG. 8B

STRUCTURE OF DEPOSITION APPARATUS

| | SAMPLE No. | EVALUATION | GENERAL EVALUATION |
|---|---|---|---|
| | | ABRASION RESISTANCE | |
| EMBODIMENT 3-1 | S 3 − 1 | A | ◎ |
| EMBODIMENT 3-2 | S 3 − 2 | A | ◎ |
| COMPARATIVE EXAMPLE 3-1 | S R 3 − 1 | D | × |
| COMPARATIVE EXAMPLE 3-2 | S R 3 − 2 | D | × |

FIG.12

OPTICAL ARTICLE INCLUDING A LAYER SIOX AS MAIN COMPONENT AND MANUFACTURING METHOD OF THE SAME

BACKGROUND

1. Technical Field

The present invention relates to an optical article having a functional thin film (functional layer), such as an anti-reflection layer, which is formed on an optical substrate made of glass or plastic, and a manufacturing method of the optical article.

2. Related Art

In a process of manufacturing various kinds of optical articles, various kinds of functional thin films (functional layers), including a hard coat layer, a colored layer, an anti-reflection layer, an anti-smudge layer, etc., are formed on an optical substrate made of glass or resin, directly or with a primer layer interposed therebetween. In addition, in a process of manufacturing a spectacle lens or other optical articles, an anti-reflection layer is formed on an optical substrate made of glass or resin, directly, or with a hard coat layer interposed therebetween, or with a primer layer and a hard coat layer interposed therebetween, in order to suppress reflection of light and increase transmittance of light. As one type of the anti-reflection layer, there is an anti-reflection layer having a multi-layered structure where a sub-layer having a low refractive index and a sub-layer having a high refractive index are stacked. The sub-layer having the low refractive index is preferably made of silicon oxide such as $SiO_2$, $SiO_x$ or the like, or $MgF_2$. The sub-layer having the high refractive index is preferably made of $ZrO_2$, $Ta_2O_5$, $TiO_2$, $CeO_2$, $Y_2O_3$ or the like. A sub-layer having a medium refractive index and made of $Al_2O_3$, $CeF_3$ or the like may be employed for the anti-reflection layer.

For formation of the functional thin film or the anti-reflection having the multi-layered structure, a vacuum deposition method is widely being used, which stacks material composing a thin film or material composing a sub-layer on an optical substrate by heating and evaporating the material in vacuum by means of an electron gun, resistance heat or the like.

P-A-2005-187936 discloses a film forming apparatus having three chambers, a third chamber of which being used to form an anti-smudge layer on an anti-reflection layer. In operation of this apparatus, after an optical substrate is put in a first chamber, the anti-reflection layer is deposited on the optical substrate in a second chamber, and then, an anti-smudge layer is formed on the anti-reflection layer in the third chamber.

It is important to improve durability, particularly, scratch resistance, of an anti-reflection layer having a multi-layered structure in order to keep a surface state, which has an great effect on an optical characteristic of an optical article, in good condition. It is known that a semiconductor optical part such as an image sensor is formed of a silicon nitride thin film having high durability and high transparency.

JP-A-5-214515 discloses a technique in which a silicon nitride thin film is formed on a substrate by depositing silicon on the substrate in vacuum and irradiating nitride ions on the deposited silicon. A silicon nitride layer has excellent transparency. For this reason, it is possible to employ the silicon nitride layer as a sub-layer of an anti-reflection layer having a multi-layered structure. For the anti-reflection layer, a homogeneous layer needs to be formed at a predetermined thickness in order to attain a desired optical effect. However, it is difficult to form the silicon nitride layer stably. In addition, the technique disclosed in JP-A-5-214515 requires precise control for deposition speed of silicon and the amount of irradiation of nitride ions.

In addition, an anti-reflection layer including a layer having a low refractive index and a layer having a high refractive index according to the above-described composition has been some designed to attain an optical system having high transparency. However, in this anti-reflection layer, a silicon nitride layer has a refractive index different from the layer having the above-described composition. Although the silicon nitride layer basically has a high refractive index, since it is different in refractive index different from other layers having a high refractive index, there is a need to design a new optical system.

In addition, when a silicon nitride layer is employed as a layer having a high refractive index, an interface between the silicon nitride layer and a silicon dioxide layer employed as a layer having a low refractive index is expected to have a composition of $SiON_x$. It is difficult to control a refractive index and a film thickness of a layer including the interface. For example, although a $Si_3N_4$ layer has a high refractive index of about 2.05, the refractive index falls within a range of 1.45 to 2.05 if a $SiN_xO_y$ layer and a $SiO_2$ layer are mixed with the $Si_3N_4$ layer. It is expected that durability of an anti-reflection layer formed of a silicon nitride sub-layer and a silicon dioxide sub-layer significantly increases. However, it is difficult to manufacture an anti-reflection layer having a sufficiently excellent optical characteristic.

In addition, it is important to provide a functional thin film having high durability, particularly, high scratch resistance in order to keep a surface state, which has an great effect on an optical characteristic of an optical article, in good condition. It is known that a semiconductor optical part such as an image sensor is formed of a silicon nitride thin film having high durability and high transparency.

In general, a silicon dioxide thin film is formed alone or as a portion of a multi layer on an optical substrate. In particular, if the optical substrate is made of resin, durability of the optical substrate depends on scratch resistance of the silicon dioxide thin film.

A silicon nitride thin film has improved scratch resistance over the silicon dioxide thin film. JP-A-5-214515 discloses a technique in which a silicon nitride thin film is formed on a substrate by depositing silicon on the substrate in vacuum and irradiating nitride ions on the deposited silicon. However, it is difficult to form the silicon nitride layer stably. The technique disclosed in JP-A-5-214515 requires precise control for deposition speed of silicon and the amount of irradiation of nitride ions.

SUMMARY

An advantage of some aspect of the invention is to provide an optical article comprising a layer that has $SiO_x$ as a main component and is formed on an optical substrate, directly or with at least one different layer interposed between the layer and the optical substrate, a surface of the layer, which is in the opposite side to the optical substrate, being nitrided.

With this configuration, since a surface of the layer, which is in the opposite side to the optical substrate, is nitrided, durability, particularly, scratch resistance, of the layer can be improved.

Preferably, the nitrided surface has main component of $Si_sO_tN_u$ (where, s>0, t≧0, and u>0).

Preferably, the layer comprises an anti-reflection layer formed on the optical substrate, directly or with at least one different layer interposed between the anti-reflection layer and the optical substrate, and an anti-smudge layer directly formed on the anti-reflection layer. The anti-reflection layer includes a plurality of sub-layers, and at least one of the plurality of sub-layers, except the outermost sub-layer of the reflection layer, includes the nitrided surface.

Preferably, the anti-reflection layer includes a plurality of low refractive index sub-layers and at least one high refractive index sub-layer interposed between the plurality of low refractive index sub-layers, one of the plurality of low refractive index sub-layers is the outermost sub-layer, and at least one of the plurality of low refractive index sub-layers includes the nitrided surface.

Preferably, the layer comprises an anti-reflection layer formed on the optical substrate, directly or with at least one different layer interposed between the anti-reflection layer and the optical substrate. The anti-reflection layer includes a plurality of sub-layers, and at least the outermost sub-layer of the plurality of sub-layers includes the nitrided surface.

Another advantage of the invention is to provide a method of manufacturing an optical article having a functional layer that is formed on an optical substrate, directly or with at least one different layer interposed between the functional layer and the optical substrate, the functional layer including at least one sub-layer.

The functional layer used herein refers to a thin film having a particular function, including an anti-reflection layer, an optical filter such as a low pass filer, a high pass filter, a band filter and the like, a hard film, etc.

The method of manufacturing an optical article comprises a process of forming the functional layer. The process of forming the functional layer includes a step of forming one sub-layer included in the functional layer by vacuum deposition, and a step of nitriding a surface of the formed one sub-layer.

Preferably, the surface nitriding step includes introducing gas containing nitrogen into a vacuum chamber in which the sub-layer forming step is performed and performing plasma treatment or ion gun treatment.

BRIEF DESCRIPTION OF THE DRAWINGS

The invention will be described with reference to the accompanying drawings, wherein like numbers reference like elements.

FIG. 4 is a table showing a result of evaluation for lenses obtained in embodiments and comparative examples according to a first embodiment.

FIGS. 8A and 8B are tables showing results of evaluation for lenses obtained in embodiments and comparative examples according to a second embodiment.

FIG. 12 is a table showing a result of evaluation for lenses obtained in embodiments and comparative examples according to a third embodiment.

DESCRIPTION OF EXEMPLARY EMBODIMENTS

First Embodiment

Figure 1:
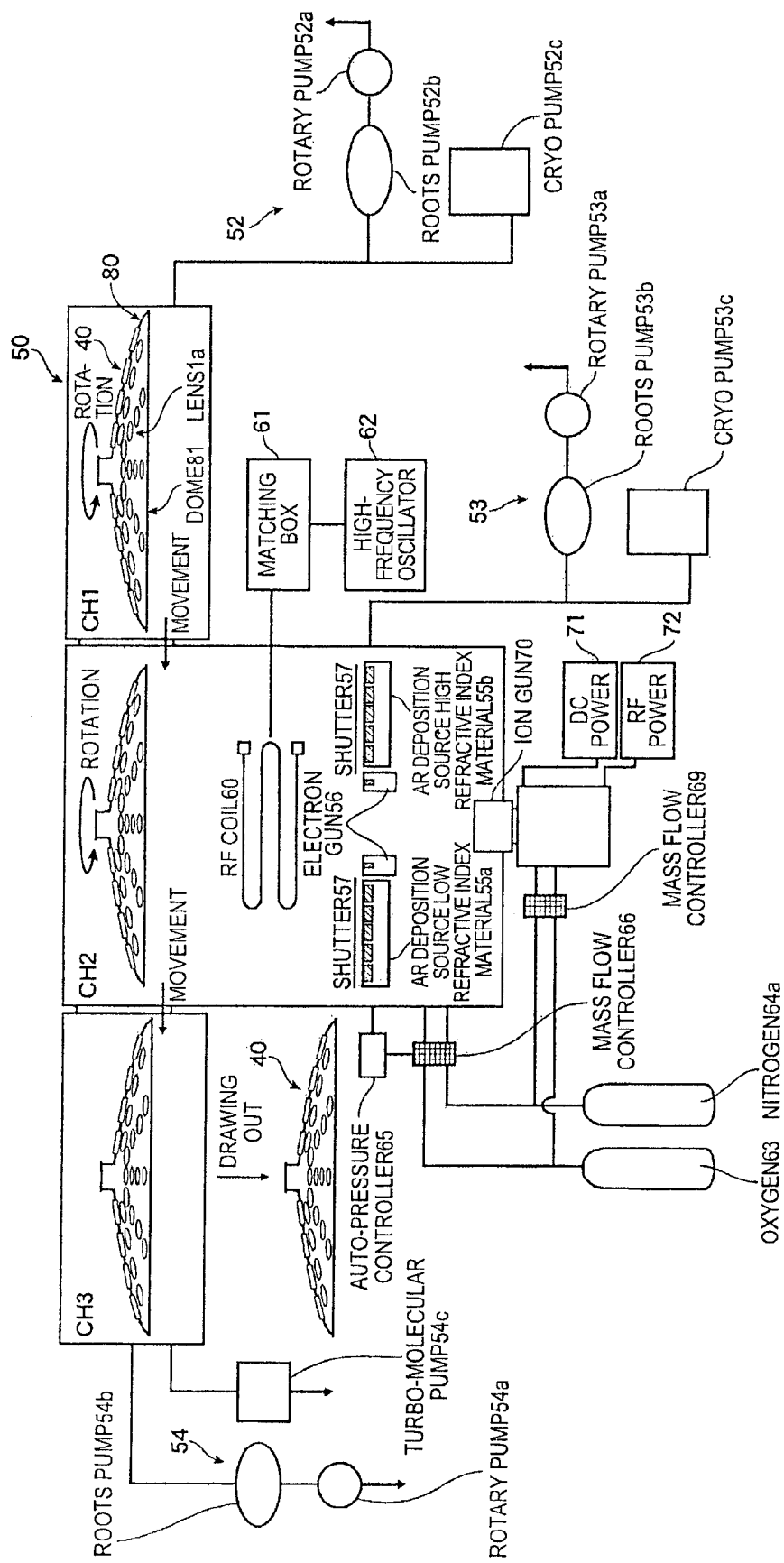
FIG. 1 is a view showing a general configuration of an apparatus for forming an anti-reflection layer.

An aspect of a first embodiment of the invention relates to a manufacturing method of an optical article, which includes a process of forming an anti-reflection layer, which has a multi-layered structure including at least one sub-layer made of silicon dioxide, on an optical substrate, directly or with at least one different layer interposed therebetween. The process of forming the anti-reflection layer includes a layer forming process of forming at least one sub-layer made of silicon dioxide by vacuum deposition and a process of nitriding a surface of the at least one sub-layer made of silicon dioxide.

The sub-layer used herein refers to a layer constituting an anti-reflection layer or a functional layer having a multi-layered structure. Specifically, the sub-layer refers to a low refractive index layer made of silicon oxide such as $SiO_2$, SiO, or the like, $MgF_2$ or the like, a high refractive index layer made of $ZrO_2$, $Ta_2O_5$, $TiO_2$, $CeO_2$, $Y_2O_3$ or the like, and a medium refractive index layer made of $Al_2O_3$, $CeF_3$ or the like.

In the manufacturing method of the optical article, one or more sub-layers made of silicon dioxide and deposited in vacuum are nitrided without using a silicon nitride layer as a single sub-layer having a multi-layered structure. That is, a surface of the sub-layer made of silicon dioxide is partially nitrided to obtain an affect of silicon nitride.

In the nitriding process, gas containing nitrogen is introduced into a vacuum chamber in which a layer forming process is performed, and plasma treatment or ion gun treatment is performed using the introduced gas. The nitriding process aims at partially or entirely nitriding a surface of a sub-layer formed by the layer forming process and made of silicon dioxide. Accordingly, there is no need to control a film thickness strictly. In addition, without precise control of time to control ion current, silicon nitride may be easily introduced into an anti-reflection layer having a multi-layered structure. In addition, scratch resistance of the anti-reflection layer can be improved by the silicon nitride. Particularly, in the plasma treatment, there is no need of an ion source, and silicon nitride can be simply introduced in a vacuum deposition apparatus or during deposition.

Another aspect of the first embodiment of the invention relates to an optical article having an anti-reflection layer formed on an optical substrate, directly or with at least one different layer interposed therebetween. The anti-reflection layer has a multi-layered structure including at least one sub-layer made of silicon dioxide, and a surface of the at least one sub-layer made of silicon dioxide, which is in the opposite to the optical substrate, is nitrided.

The at least one silicon dioxide sub-layer of the anti-reflection layer of the optical article according to the another aspect of the first embodiment of the invention includes a partial layer that contains nitrogen and is provided at the opposite side to the optical substrate. The partial layer used herein refers to a surface portion of a sub-layer made of silicon dioxide. In the invention, a surface portion of at least one sub-layer made of silicon dioxide is nitrided. That is, the at least one sub-layer made of silicon dioxide is a layer including a nitrided portion (a surface-nitrided layer).

By nitriding a sub-layer made of silicon dioxide, the at least one sub-layer made of silicon dioxide is formed with the partial layer that contains nitrogen and is provided at the opposite side to the optical substrate. Accordingly, since a surface of the anti-reflection layer which is susceptible to scratch is silicon-nitrided, scratch resistance of the surface can be improved.

The partial layer contains $Si_sO_tN_u$ (where, s and u are a positive number, and t is a number more than 0). When the sub-layer made of silicon dioxide is nitrided, a region that contains silicon nitride is formed on a surface of the sub-layer partially or entirely, thereby improving scratch resistance. In addition, the partial layer formed by the nitriding treatment has limited thickness and/or area and keeps an optical characteristic of silicon nitride, as a sub-layer. Accordingly, there is almost no need to retry a film design for the anti-reflection layer. In addition, it is possible to improve scratch resistance by silicon nitride while maintaining a characteristic of the sub-layer made of silicon dioxide that provides adhesiveness between a substrate and an upper layer.

In the optical article according to the first embodiment of the invention, it is preferable that at least one sub-layer, which is made of silicon dioxide and is nitrided, is the farthest layer of the anti-reflection layer from the optical substrate. In addition, in the optical article according to the first embodiment of the invention, it is preferable that at least one of partial layers that contain nitrogen is the outermost layer of the anti-reflection layer. At least one sub-layer, which is made of silicon dioxide and is nitrided to assist in improving the scratch resistance of the anti-reflection layer, may be any layer of a multi-layered structure. In addition, it is preferable that the uppermost layer that is most susceptible to scratch, that is, a sub-layer that forms a surface opposite to the optical substrate, is nitrided.

FIG. 1 shows a general configuration of a film forming apparatus 50 for forming an anti-reflection layer 3 having a multi-layered structure on a surface of a substrate (work) 40 mounted on a supporting apparatus 80. The supporting apparatus 80 has a convex disc-like dome 81 on which a plurality of work substrates (optical substrates, more specifically, lens substrates) 40 are concentrically arranged. Films are formed on the work substrates 40 while the supporting apparatus 80 rotates the dome 81. The film forming apparatus 50 has three chambers CH1, CH2 and CH3 through which the supporting apparatus 80 passes. The chambers CH1 to CH3 can be separately sealed up, and internal pressure of the chambers CH1 to CH3 is controlled by vacuum generating apparatuses 52, 53 and 54, respectively.

The chamber CH1, which is an entrance or gate chamber, introduces the supporting apparatus 80 from the outside and performs a degassing operation by keeping its inside below a specified pressure for a specified time. The chamber CH1 is provided with the vacuum generating apparatus 52 having a rotary pump 52a, a roots pump 52b and a cryo pump 52c.

The chamber CH2 is a second chamber for forming an anti-reflection layer (AR layer). To the end, inside the chamber CH2 are provided AR deposition sources 55a and 55b, an electron gun 56 for depositing the AR deposition sources 55a and 55b, and shutters 57 that can be opened/closed to adjust the amount of deposition. The anti-reflection layer has a stacked structure including a low refractive index sub-layer having silicon dioxide as a main component and a high refractive index sub-layer made of other compositions, for example, one or more of $TiO_2$, $Nb_2O_3$, $Ta_2O_5$, $ZrO_2$. To the end, at least two deposition sources 55a and 55b and electron guns 56 for heating and melting the deposition sources 55a and 55b are prepared in the chamber CH2. The chamber CH2 keeps at an appropriate pressure by the vacuum generating apparatus 53 having a rotary pump 53a, a roots pump 53b and a cryo pump 53c.

In addition, a mass flow controller 66 for controlling a chamber atmosphere is connected to the chamber CH2. An oxygen gas supply source 63 and a nitride gas supply source 64a are connected to the mass flow controller 66. The mass flow controller can control the atmosphere of the chamber CH2 to be in 100% oxygen gas or nitrogen gas, or a proper mixture thereof.

In addition, inside the chamber CH2 is provided an RF coil 60 for generating high frequency plasma. When the RF coil 60 is connected to a high frequency oscillator 62 via a matching box 61, plasma having predetermined power can be generated at a predetermined frequency in the chamber CH2.

In addition, inside the chamber CH2 is provided an ion gun 70. The ion gun 70 is connected to a DC power supply 71 and an RF power supply 72 and irradiates ions having specified energy on the work substrates 40 supported on the support apparatus 80. The oxygen gas supply source 63 and the nitrogen gas supply source 64a are connected to the ion gun 70 via the mass flow controller 69. The ion gun 70 can irradiate oxygen ions or nitrogen ions on the work substrates 40.

The chamber CH 3 is an exit chamber. After the supporting apparatus 80 on which the work substrates 40 having the anti-reflection layers formed their one sides are mounted moves from the chamber CH2 to the chamber CH3, the work substrates 40 are reversed and the supporting apparatus 80 returns to the chamber CH2. Subsequently, after anti-reflection layers are formed on the other sides of the work substrates 40, the supporting apparatus 80 returns to the chamber CH3 and then is drawn out of the chamber CH3 by returning the pressure of the chamber CH3 to an atmosphere pressure. The chamber CH3 keeps at an appropriate pressure by the vacuum generating apparatus 54 having a rotary pump 54a, a roots pump 54b and a turbo-molecular pump 54c. The work substrates 40 on the supporting apparatus 80 drawn out of the chamber CH3 are injected into a thermo-hygrostat (not shown) and are annealed at appropriate humidity and temperature. Also, the work substrates 40 are aged when they are left alone in a room for a specified period of time.

The film forming apparatus 50 can nitride a low refractive index sub-layer having silicon dioxide as its main component using a plasma generating apparatus (RF coil) 60 or the ion gun 70 provided in the chamber CH2. After the inside of the chamber CH2 is put in a nitrogen atmosphere or a mixture atmosphere of nitrogen and oxygen by means of an auto-pressure controller 65, the sub-layer made of silicon dioxide can be nitrided by irradiating nitrogen ions on the sub-layer in plasma generated by the RF coil 60. The inside of the chamber CH2 may be put in an atmosphere of nitrogen-argon or nitrogen-oxygen-argon. In addition, a surface of the sub-layer made of silicon dioxide can be nitrided by irradiating nitrogen ions on the work substrates 40 by means of the ion gun 70.

It is difficult to form a sub-layer made of silicon nitride by vacuum deposition. However, it is relatively easy to form a nitride on a surface by subjecting silicon oxide to plasma treatment or ion gun treatment. In this case, on the surface is formed a mixture of a compound of nitrogen and silicon, such as $Si_sO_tN_u$ (where, s and u are a positive number, and t is a number more than 0), and $SiO_2$, in addition to $Si_3O_4$. That is, a partial layer that contains nitride is partially or entirely formed on a surface of the sub-layer made of silicon dioxide, thereby improving durability of the surface. In addition, since the sub-layer surface on which the nitride-contained partial layer is formed is extremely thin, a film design for the anti-reflection layer is not nearly affected.

Figure 2:
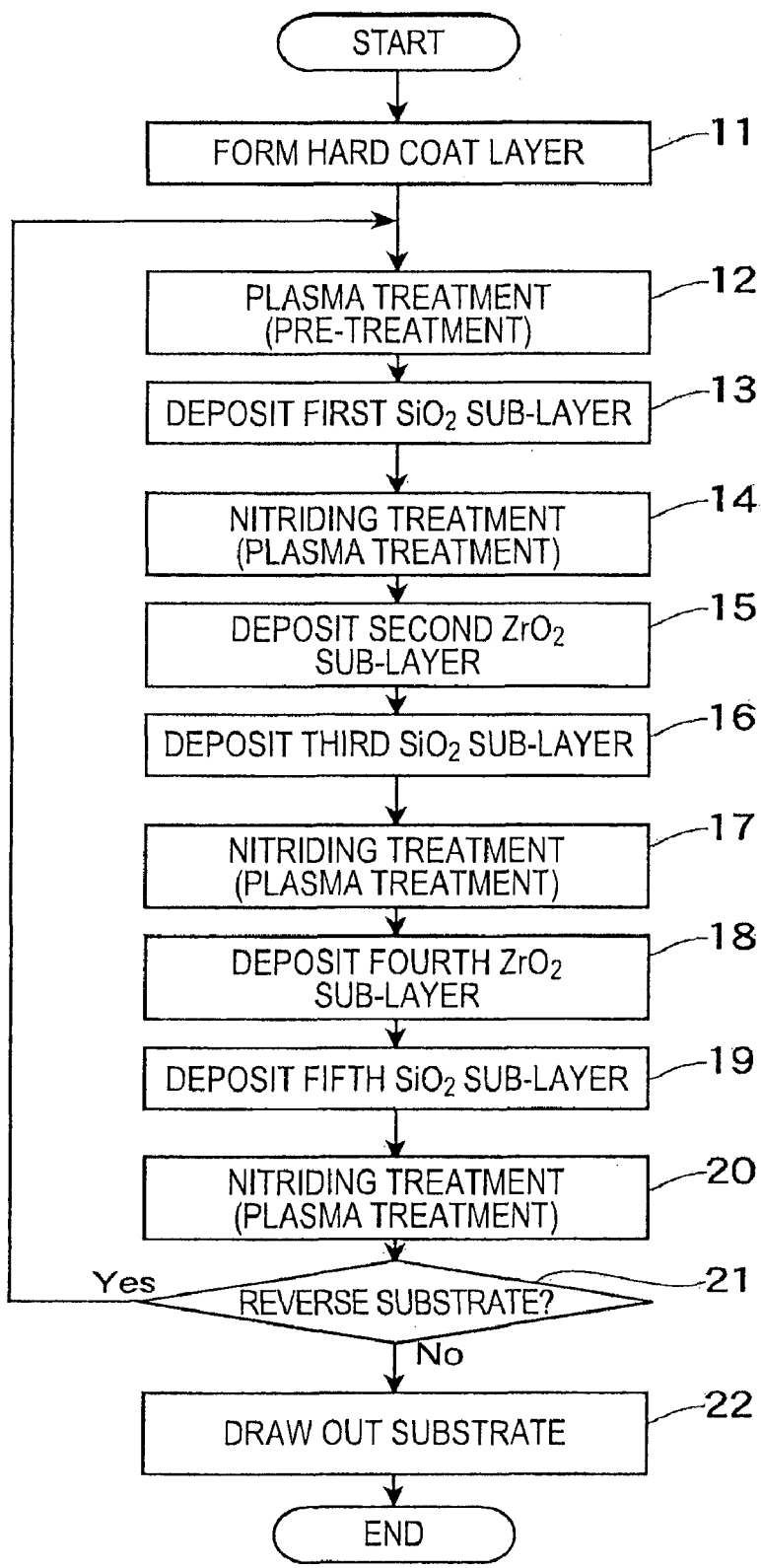
FIG. 2 is a flow chart illustrating a manufacturing method of a lens according to a first embodiment.
Figure 3:
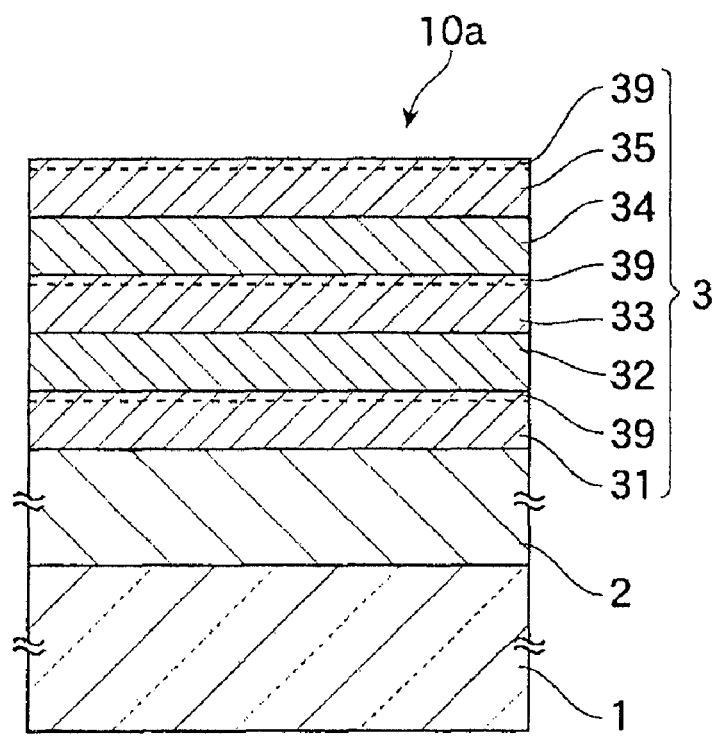
FIG. 3 is an enlarged sectional view of a general structure of an anti-reflection layer.

FIG. 2 is a flow chart illustrating a process of forming an anti-reflection layer having a multi-layered structure on the work substrate 40 in the film forming apparatus 50. In addition, FIG. 3 shows a section of a film (layer) structure of an optical article 10a including an anti-reflection layer 3.

The anti-reflection layer 3 includes, for example, a first sub-layer 31 made of silicon oxide and formed on a base material (optical substrate)₁, a second sub-layer 32 made of zirconium oxide, a third sub-layer 33 made of silicon oxide, a fourth sub-layer 34 made of zirconium oxide, and a fifth sub-layer 35 made of silicon oxide.

If the optical substrate 1 is made of plastic, a hard coat layer 2 is formed on the optical substrate 1, prior to the anti-reflection layer 3, at Step 11. A primer layer may be further formed to improve adhesion between the hard coat layer 2 and the optical substrate 1. The hard coat layer 2 gives scratch resistance to a plastic lens 1. In addition, the hard coat layer 2 is interposed between the plastic lens 1 and the anti-reflection layer 3, thereby improving adhesion between the plastic lens 1 and the anti-reflection layer 3 and preventing the anti-reflection layer 3 from being peeled from the plastic lens 1. Accordingly, even if adhesion would not otherwise be high between the anti-reflection layer 3 and the plastic lens 1, the adhesion therebetween can be improved by the interposed hard coat layer 2.

It is common that the hard coat layer 2 is obtained by applying a curable composition on a surface of the plastic lens 1 and curing a formed film. If the plastic lens 1 is made of thermoplastic resin, it is preferable to cure the applied curable composition using an electromagnetic wave such as an ultraviolet ray or an ionizing radiation such as an electron beam, rather than thermosetting.

For example, as the curable composition, there is an inorganic particle-contained curable composition including a silicon compound that generates a silanol group by ultraviolet irradiation, and a photocurable silicon composition, which mainly consists of organopolysiloxane having halogen atoms that cause a condensation reaction with a silanol group, and a reacting group such as an amino group. In addition, the inorganic particle-contained curable composition includes an acryl ultraviolet curable monomer composition such as Uk-6074 available from Mitsubishi Rayon Co., Ltd., and inorganic particles having a diameter of 1 to 100 nm, such as $SiO_2$, $TiO_2$ or the like. In addition, this composition may be made by dispersing a photocurable silicon composition, an acryl ultraviolet curable monomer composition and inorganic particles into a silane compound or a silane coupling agent having a polymerization group such as a vinyl group, an allyl group, an acryl group or a metacryl group, and a hydrolyzable group such as a methoxy group.

The formed film to be hard coat layer 2 may be formed using a dipping method, a spin coat method, a spray method, a flow method, a doctor blade method or the like. In addition, before the film is formed, it is preferable to treat the surface of the plastic lens 1 using a corona discharging or a high voltage discharging of a microwave or the like in order to improve adhesion. The hard coat layer 2 is obtained by curing the formed film using heat, an ultraviolet ray, an electron beam or the like.

The optical substrate 1 formed with the hard coat layer 2 is set as the work substrate 40 in the supporting apparatus 80 and is carried into the film forming apparatus 50. In the film forming apparatus 50, the supporting apparatus 80 is first introduced into the chamber CH1 and is degassed, and then is moved to the chamber CH2 for plasma treatment at Step 12. The first sub-layer 31 made of silicon oxide is formed (layer forming process) at Step 13, and then a surface of the first sub-layer 31 is nitrided by the plasma treatment or the ion gun treatment (nitriding process) at Step 14. Accordingly a partial layer 39 containing a nitride is partially or entirely formed on the surface (in the opposite side to the optical substrate 1) of the first sub-layer 31 made of silicon oxide. At this time, gas of any composition including nitrogen is used as introduced gas. For example, the introduced gas may include 100% nitrogen, a mixture of nitrogen and oxygen, a mixture of nitrogen and argon, a mixture of nitrogen, oxygen and argon, etc.

The second sub-layer 32 made of zirconium oxide is formed at Step 15, and then the third sub-layer 33 made of silicon oxide is formed at Step 16. Then, a surface of the third sub-layer 33 is nitrided at Step 17, as in Step 14. At Steps 15 and 16, the second sub-layer 32 having a high refractive index 32 and the third sub-layer 33 having a low refractive index are successively formed. Thereafter, the surface of the third sub-layer 33 having the low refractive index is nitrided at Step 17. That is, by successively performing the layer forming process at Step 16 and the nitriding process at Step 17, the surface of the sub-layer formed by the layer forming process can be nitrided. If Steps 15 and 16 are taken as a single layer forming process, a surface of a sub-layer formed before being nitrided can be nitrided at Step 17.

The fourth sub-layer 34 made of zirconium oxide is formed at Step 18, and then the fifth sub-layer 35 made of silicon oxide is formed at Step 19. Then, a surface of the fifth sub-layer 35 is nitrided at Step 20, as in Step 14. Accordingly, the anti-reflection layer having the five sub-layers is formed on one side of the optical article. Next, after the work substrate 40 is reversed at Step 21 and then is set in the supporting apparatus 80, Steps 12 to 20 are repeated to form the anti-reflection layer 3 having the multi-layered structure. When the anti-reflection layer 3 is formed on both sides of the work substrate 40, the optical substrate 1 (the work substrate 40) is drawn out of the chamber CH3 at Step 22.

Here, the nitriding process may be performed for the uppermost sub-layer 35 or any two sub-layers including the uppermost sub-layer 35 of the three silicon oxide sub-layers 31, 33 and 35. Since only an extremely thin surface of the silicon oxide sub-layer is nitrided in the nitriding process, performance of the anti-reflection layer 3 is not nearly affected.

Embodiment 1-1

Hereinafter, several examples of manufacturing a plastic spectacle lens as the optical article according to the manufacturing method shown in FIG. 2 will be described. In the following embodiments and comparative examples, a plastic spectacle lens base material (Seiko Supper Sovereign available from Seiko Epson Corporation) is used as the optical substrate 1. At Step 11, the hard coat layer 2 is formed on the both sides of the optical substrate 1. In subsequent Steps, the anti-reflection layer 3 is formed on the work substrate 40 which refers to the optical substrate 1 having the hard coat layer 2 formed on its both sides.

The work substrate 40 is set on the dome 81 of the supporting apparatus 80 whose concave side directs downward, and then is carried into the film forming apparatus 50. At Step 12, after degassing the chamber CH1, 100% argon gas is introduced into the chamber CH2, and the work substrate 40 is treated by plasma generated by a high frequency plasma generating apparatus while keeping a pressure of the gas at $4.0 \times 10^{-2}$ Pa. The plasma treatment is conducted for one minute under conditions of frequency of 13.56 MHz and power of 400 W. This aims at cleaning a surface of the optical substrate 1 in order to improve adhesion between the optical substrate 1 and the anti-reflection layer 3.

Subsequently, Steps 13 to 20 are performed so that the sub-layers 31, 33 and 35 made of $SiO_2$ and the sub-layers 32 and 34 made of $ZrO_2$ are alternately deposited to form the anti-reflection layer 3 comprising these sub-layers. At this time, the film thickness of the first sub-layer ($SiO_2$) 31 is $0.09\lambda$, the film thickness of the second sub-layer ($ZrO_2$) 32 is $0.16\lambda$, the film thickness of the third sub-layer ($SiO_2$) 33 is $0.05\lambda$, the film thickness of the fourth sub-layer ($ZrO_2$) 34 is $0.27\lambda$, and the film thickness of the fifth sub-layer ($SiO_2$) 35 is 0.272.

The uppermost sub-layer 35 of the anti-reflection layer 3 is a $SiO_2$ layer. Also, the plasma generating apparatus 60 is used for the nitriding process at Steps 14, 17 and 20. For this reason, after the $SiO_2$ layer is deposited, nitrogen gas and oxygen gas are introduced with a ratio of 7:3 into the chamber, and the high frequency plasma generating apparatus generates plasma while keeping a pressure of the gases at $4.0 \times 10^{-2}$ Pa. The plasma treatment is conducted for five minutes under conditions of frequency of 13.56 MHz and power of 600 W. Accordingly, partial layers 39 containing a nitride are formed on surfaces of the first, third and fifth $SiO_2$ sub-layers 31, 33 and 35. That is, the first, third and fifth sub-layers 31, 33 and 35 become nitrided layers (surface nitrided layers).

Thereafter, at Step 21, the supporting apparatus 80 is moved to the chamber CH3, the supporting apparatus 80 is drawn out of the chamber, the lens is reversed and set on the dome 81 of the supporting apparatus 80 whose convex side directs downward, and then, the above-described processes are repeated. Next, at Step 22, the work substrate 40 is drawn out of the chamber CH3. Accordingly, a plastic lens (sample S1-1) having the anti-reflection layer 3 is formed on the both sides of the work substrate 40 (lens base material 1), that is, on the opposite side to the optical substrate 1 of the hard coat layer 2. In the sample S1-1, surfaces of the $SiO_2$ sub-layers 31, 33 and 35 of the anti-reflection layer 3, that is, surfaces in the opposite side to the optical substrate 1, are nitrided.

Embodiment 1-2

In embodiment 1-2, a plastic lens (sample S1-2) having the anti-reflection layer 3 having the five sub-layers is manufactured according the above-described steps in embodiment 1-1 except Steps 14 and 17. Accordingly, in the sample S1-2 of embodiment 1-2, only the outermost layer (fifth sub-layer) 35 of the silicon dioxide sub-layers 31, 33 and 35 included in the anti-reflection layer 3 (that is, the sub-layer 35 of the anti-reflection layer 3 which forms a surface in the opposite side to the optical substrate 1) is nitrided to form the partial layer 39 containing a nitride.

Embodiment 1-3

In embodiment 1-3, a plastic lens (sample S1-3) having the anti-reflection layer 3 having the five sub-layers is manufactured according the above-described steps in embodiment 1-1 except Step 14. Accordingly, in the sample S1-3 of embodiment 1-3, only the third sub-layer 33 and the fifth sub-layer 35 of the silicon dioxide sub-layers 31, 33 and 35 included in the anti-reflection layer 3 are nitrided to form the partial layer 39 containing a nitride.

Embodiment 1-4

In embodiment 1-4, a plastic lens (sample S1-4) having the anti-reflection layer 3 having the five sub-layers is manufactured according the above-described steps in embodiment 1-1 except Step 17. Accordingly, in the sample S1-4 of embodiment 1-4, only the first sub-layer 31 and the fifth sub-layer 35 of the silicon dioxide sub-layers 31, 33 and 35 included in the anti-reflection layer 3 are nitrided to form the partial layer 39 containing a nitride.

Embodiment 1-5

In embodiment 1-5, Steps 12 to 20 are performed to nitride the entire of the silicon dioxide sub-layers 31, 33 and 35 included in the anti-reflection layer 3. In this case, instead of the plasma generating apparatus 60, the ion gun 70 is used for the nitriding process at Steps 14, 17 and 20. Accordingly, the nitrogen gas 64a and the oxygen gas 63 are introduced with a ratio of 7:3 and at a flow of 35 SCCM into the ion gun 70, and then, the ion gun 70 irradiates nitrogen and oxygen ions on the sub-layers 31, 33 and 35. The ion irradiation is conducted for five minutes under conditions of frequency of 13.56 MHz, RF power of 450 W, acceleration voltage of 500 V, and suppressor voltage of 300 V while keeping an internal pressure of the chamber at $4.0 \times 10^{-3}$ Pa. Other processes are the same as embodiment 1-1.

Accordingly, in the sample S1-5 of embodiment 1-5, all of the silicon dioxide sub-layer 31, 33 and 35 included in the anti-reflection layer 3 are nitrided to form the partial layer 39 containing a nitride.

Embodiment 1-6

In embodiment 1-6, a lens having an anti-reflection layer 3 having seven sub-layers is manufactured. Accordingly, a process of depositing a sixth sub-layer, a process of depositing a seventh silicon dioxide sub-layer as the outermost sub-layer, and a process of nitriding the outermost sub-layer are further performed. In addition, instead of $ZrO_2$, $TiO_2$ is used to form a high refractive index sub-layer. Other processes are the same as embodiment 1-1.

In the process of forming the high refractive index sub-layer, $TiO_2$ is deposited by ion assist deposition. At this time, 100% oxygen gas is introduced at a flow of 35 SCCM into the ion gun 70. Ion irradiation is conducted under conditions of frequency of 13.56 MHz, RF power of 450 W, acceleration voltage of 500 V, and suppressor voltage of 300 V while keeping an internal pressure of the chamber at $4.0 \times 10^{-3}$ Pa. At this time, the film thickness of the first sub-layer ($SiO_2$) is 0.08%, the film thickness of the second sub-layer ($TiO_2$) is $0.07\lambda$, the film thickness of the third sub-layer ($SiO_2$) is 0.10, the film thickness of the fourth sub-layer ($TiO_2$) is 0.18, the film thickness of the fifth sub-layer ($SiO_2$) is 0.07, the film thickness of the sixth sub-layer ($TiO_2$) is $0.14\lambda$, and the film thickness of the seventh sub-layer ($SiO_2$) is $0.26\lambda$.

Accordingly, in the sample S1-6 of embodiment 1-6, all of the silicon dioxide sub-layers included in the anti-reflection layer 3 are nitrided to form the partial layer 39 containing a nitride.

Comparative Example 1-1

In comparative example 1-1, a plastic lens (sample SR1-1) that is not nitrided and has the same composition as embodiment 1-1, that is, the anti-reflection layer 3 having the five sub-layers including the low refractive index $SiO_2$ sub-layer and the high refractive index $ZrO_2$ sub-layer is manufactured without performing Steps 14, 17 and 20. Other processes are the same as embodiment 1-1. Accordingly, in the sample SR1-1 of comparative example 1-1, none of the silicon dioxide sub-layers 31, 33 and 35 included in the anti-reflection layer 3 is nitrided.

Comparative Example 1-2

In comparative example 1-2, a plastic lens (sample SR1-2) that is not nitrided and has the same composition as embodiment 1-6, that is, the anti-reflection layer 3 having the seven sub-layers including the low refractive index $SiO_2$ sub-layer and the high refractive index $TiO_2$ sub-layer is manufactured. Other processes are the same as embodiment 1-6. Accordingly, in the sample SR1-2 of comparative example 1-2, none of the silicon dioxide sub-layers included in the anti-reflection layer 3 is nitrided.

Evaluation

Scratch resistance of the samples S1-1 to S1-6 of embodiments 1-1 to 1-6 and the samples SR1-1 and SR1-2 of comparative examples 1-1 and 1-2 are evaluated according to the following method. A result of the evaluation is listed in FIG. 4. A steel wool (#0000) wound on a jig is fifty times reciprocated with load of 2 kg on the outermost surface of the anti-reflection layer 3 of the samples S1-1 to S1-6 and SR1-1 and SR1-2. A level of scratch on the outermost surface is evaluated in four grades of A, B, C and D in comparison with a reference sample. Here, A indicates the best, and B, C and D indicate worse in order.

In the sample S1-1 to S1-6 of embodiments 1-1 to 1-6, at least one silicon oxide sub-layer was nitrided. An evaluation of a scratch resistance test for the samples S1-1 to S1-6 is good (A). On the other hand, an evaluation of a scratch resistance test for the samples SR1-1 and SR1-2 of comparative examples 1-1 and 1-2, which were not nitrided, is bad (D).

Evaluating collectively, the samples S1-1 to S1-6 of the embodiments are all excellent (⊙) as products. The samples SR1-1 and SR1-2 of comparative examples are all disallowable (x). As a result, it can be known that the scratch resistance is improved by nitriding at least one of the silicon dioxide sub-layers.

In addition, although explicitly not shown in the table (evaluation result) of FIG. 4, the scratch resistance of the samples of embodiments 1-2, 1-3 and 1-4 in which only the uppermost sub-layer and any two sub-layers including the uppermost sub-layer are nitrided is slightly inferior to that of the samples of embodiments 1-1, 1-5 and 1-6 in which all the silicon dioxide sub-layers are nitrided, although the scratch resistance of all the samples is equally good (A). However, this difference is sufficiently acceptable.

In addition, the first embodiment relates to an optical article in which the anti-reflection layer is formed on the plastic spectacle lens having the hard coat layer. In case of an optical article having a glass base material, the anti-reflection layer may be formed on the glass base material without the hard coat layer interposed therebetween, or the manufacturing method according to the above-described embodiment can be applied to the optical article having the glass base material. In addition, the optical article is not limited to the spectacle lens, but may include optical products, for example, an optical device of an image displaying apparatus, a prism, an optical fiber, an optical device for an information recording medium, a filter, etc., to which the manufacturing method according to the above-described embodiment can be applied.

Second Embodiment

For an optical article in general use, such as a spectacle lens, there is often provided a layer having an anti-smudge function such as a water repellency function (anti-smudge layer). The anti-smudge layer aims at preventing optical performance from being deteriorated due to surface contamination by oil and fat or the like. A fluorine-containing silane compound is most appropriate for the composition of the anti-smudge layer. The anti-smudge layer made of fluorine-containing silane compound has good water repellency and anti-smudge properties. In addition, if the uppermost sub-layer of the anti-reflection layer is made of silicon oxide, the anti-smudge layer made of fluorine-containing silane compound has high adhesion with the surface of the anti-reflection layer and has high durability. It is believed that this is because a siloxane couple is formed by oxygen atoms of the surface of the anti-reflection layer between the anti-reflection layer and the anti-smudge layer.

On the other hand, if the uppermost sub-layer of the anti-reflection layer is made of silicon nitride, instead of silicon oxide, it is difficult to form the siloxane couple and the durability of the anti-smudge layer is apt to be deteriorated. Accordingly, if there exists a silicon nitride layer on the uppermost sub-layer of the anti-reflection layer, the anti-smudge layer formed on the silicon nitride layer is prevented from reacting with the uppermost sub-layer of the anti-reflection layer, which results in deterioration of the durability of the anti-smudge layer.

An aspect of a second embodiment of the invention relates to a manufacturing method of an optical article, which includes a process of forming an anti-reflection layer, which has a multi-layered structure including a plurality of low refractive index sub-layers and at least one high refractive index sub-layer, and an anti-smudge layer on an optical substrate, directly or with at least one different layer interposed therebetween. The process of forming the anti-reflection layer and the anti-smudge layer includes a first process of forming a first low refractive index sub-layer, a nitriding process of nitriding a surface of the first low refractive index sub-layer, a second process of forming a second low refractive index sub-layer on the first low refractive index sub-layer, with at least one high refractive index sub-layer interposed therebetween, and a process of forming the anti-smudge layer on the second low refractive index sub-layer directly.

The sub-layers used herein is the same as the first embodiment. In the manufacturing method of this optical article, a low refractive index sub-layer made of silicon dioxide or the like is nitrided without using a silicon nitride layer as a single sub-layer having a multi-layered structure. That is, a surface of the low refractive index sub-layer is partially nitrided to obtain an affect of improving film strength. Since this manufacturing method has a merit, which may be caused by nitriding, while maintaining a layer structure of the anti-reflection layer including the low refractive index sub-layer made of silicon dioxide, for example, the second low refractive index sub-layer on which the anti-smudge layer is stacked may be not nitrided, and moreover, in a system in which the anti-smudge layer is stacked on the anti-reflection layer, the durability of the anti-smudge layer can be secured.

Accordingly, in the first and second processes, it is preferable that the first and second low refractive index sub-layers are made of silicon dioxide.

In this manufacturing method, the first low refractive index sub-layer is formed by vacuum deposition in the first process. In the nitriding process, gas that contains nitrogen is introduced into a vacuum chamber in which the first process is performed, and then, the introduced gas is subjected to plasma treatment or ion gun treatment. Accordingly, a surface of a low refractive index sub-layer made of silicon dioxide or the like can be partially or entirely nitrided. Accordingly, there is no need to control a film thickness strictly in order to introduce a nitrided layer. In addition, without precise control of time to control ion current, silicon nitride may be easily introduced into an anti-reflection layer having a multi-layered structure. Accordingly, scratch resistance of the anti-reflection layer can be improved by the silicon nitride. Particularly, in the plasma treatment, there is no need of an ion source, and silicon nitride can be simply introduced in a vacuum deposition apparatus or during deposition.

Another aspect of the second embodiment of the invention relates to an optical article having an anti-reflection layer and an anti-smudge layer formed on an optical substrate, directly or with at least one different layer interposed therebetween. The anti-reflection layer includes a first low refractive index sub-layer and a second low refractive index sub-layer. A surface of the first low refractive index sub-layer, which is in the opposite side to the optical substrate, is nitrided, and the second low refractive index sub-layer is formed on the first low refractive index sub-layer, at the opposite side to the optical substrate with at least one high refractive index sub-layer interposed therebetween. In addition, the anti-smudge layer is directly stacked on the second low refractive index sub-layer at the opposite side to the optical substrate.

In addition, the optical article according to the another aspect of the second embodiment of the invention has an anti-reflection layer and an anti-smudge layer formed on an optical substrate, directly or with at least one different layer interposed therebetween. The anti-reflection layer includes a first low refractive index sub-layer and a second low refractive index sub-layer. On a surface of the first low refractive index sub-layer, which is in the opposite side to the optical substrate, is formed a partial layer that contains nitrogen, and the second low refractive index sub-layer is formed on the first low refractive index sub-layer at the opposite side to the optical substrate, with at least one high refractive index sub-layer interposed therebetween. In addition, the anti-smudge layer is directly stacked on the second low refractive index sub-layer at the opposite side to the optical substrate. The partial layer used herein is the same as the first embodiment.

That is, the optical article has the anti-reflection layer formed on the optical substrate, directly or with at least one different layer interposed therebetween, and the anti-smudge layer directly formed on the anti-reflection layer. The anti-reflection layer includes a plurality of sub-layers. Of the plurality of sub-layers, at least one sub-layer except the outermost sub-layer of the anti-reflection layer is a surface-nitrided layer, that is, a layer that has $SiO_2$ as a main component and includes a nitrided surface which is in the opposite side to the optical substrate. One type of the anti-reflection layer includes a plurality of low refractive index sub-layers. One of the plurality of low refractive index sub-layers is the outermost layer. At least one of the plurality of low refractive index sub-layers is a surface-nitrided layer. The low refractive index outermost layer is formed on a different low refractive index layer, at the opposite side to the optical substrate, with at least one high refractive index layer interposed therebetween.

By nitriding the first low refractive index sub-layer, the at least one sub-layer is formed with the partial layer that contains nitrogen and is provided at the opposite side to the optical substrate. Accordingly, since a surface of the sub-layer which is susceptible to scratch is nitrided, scratch resistance of the surface can be improved. In addition, since the second low refractive index sub-layer on which the anti-smudge layer is stacked is not nitrided, the adhesion between the second low refractive index sub-layer and the anti-smudge layer is maintained, thereby improving the durability of the anti-smudge layer.

It is preferable that the first and second low refractive index sub-layers are made of silicon dioxide. In this case, the partial layer contains $Si_sO_tN_u$ (where, s and u are a positive integral number, and t is an integral number more than 0). When the sub-layer made of silicon dioxide is nitrided, a region that contains silicon nitride is formed on a surface of the sub-layer partially or entirely, thereby improving scratch resistance. In addition, the partial layer formed by the nitriding treatment has limited thickness and/or area and keeps an optical characteristic of silicon dioxide, as a sub-layer. Accordingly, there is almost no need to retry a film design for the anti-reflection layer. In addition, it is possible to improve scratch resistance by silicon nitride while maintaining a characteristic of the sub-layer made of silicon dioxide that provides adhesiveness between a substrate and an upper layer. In addition, since the silicon oxide of the uppermost layer on which the anti-smudge layer is stacked is not nitrided, the scratch resistance can be improved while maintaining the durability of the anti-smudge layer.

A fluorine-containing silane compound is appropriate for the composition of the anti-smudge layer. One example of the fluorine-containing silane compound appropriate for the anti-smudge layer is one indicated by the following general formula (1).

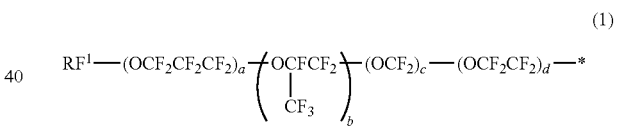

(1)

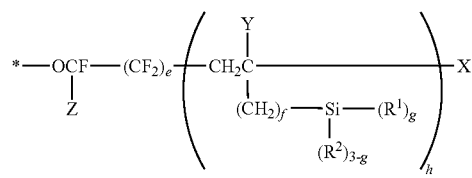

In the general formula (1), $Rf^1$ is a perfluoroalkyl group, X is hydrogen, bromine or iodine, Y is hydrogen or a low alkyl group, Z is fluorine or a trifluoromethyl group, $R^I$ is a hydroxyl group or a hydrolysis group, and $R^2$ is hydrogen or a 1-valued hydrocarbon group. a, b, c, d and e are an integral number of 0 or more than 1, $a+b+c+d+e$ is at least 1, a sequence of repetition unit tied by a, b, c, d and e is not limited. f is 0, 1 or 2. g is 1, 2 or 3. h is an integral number of more than 1.

Another example of the fluorine-containing silane compound appropriate for the anti-smudge layer is one indicated by the following general formula (2).

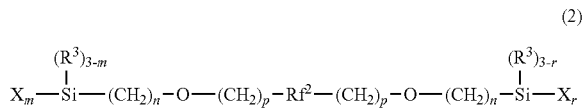

(2)

In the general formula (2), $Rf^2$ includes the unit indicated by a formula: —$(C_kF_{2k})O$— (where, k is an integral number of 1 to 6) and indicates a two-valued group having a straight chained perfluoropolyalkylether structure with no branch. $R^3$ is a 1-valued hydrocarbon group having 1 to 8 carbon atoms and X is a hydrolysis group or halogen atoms. p is 0, 1 or 2. n is an integral number of 1 to 5. m and r are 2 or 3.

Figure 5:
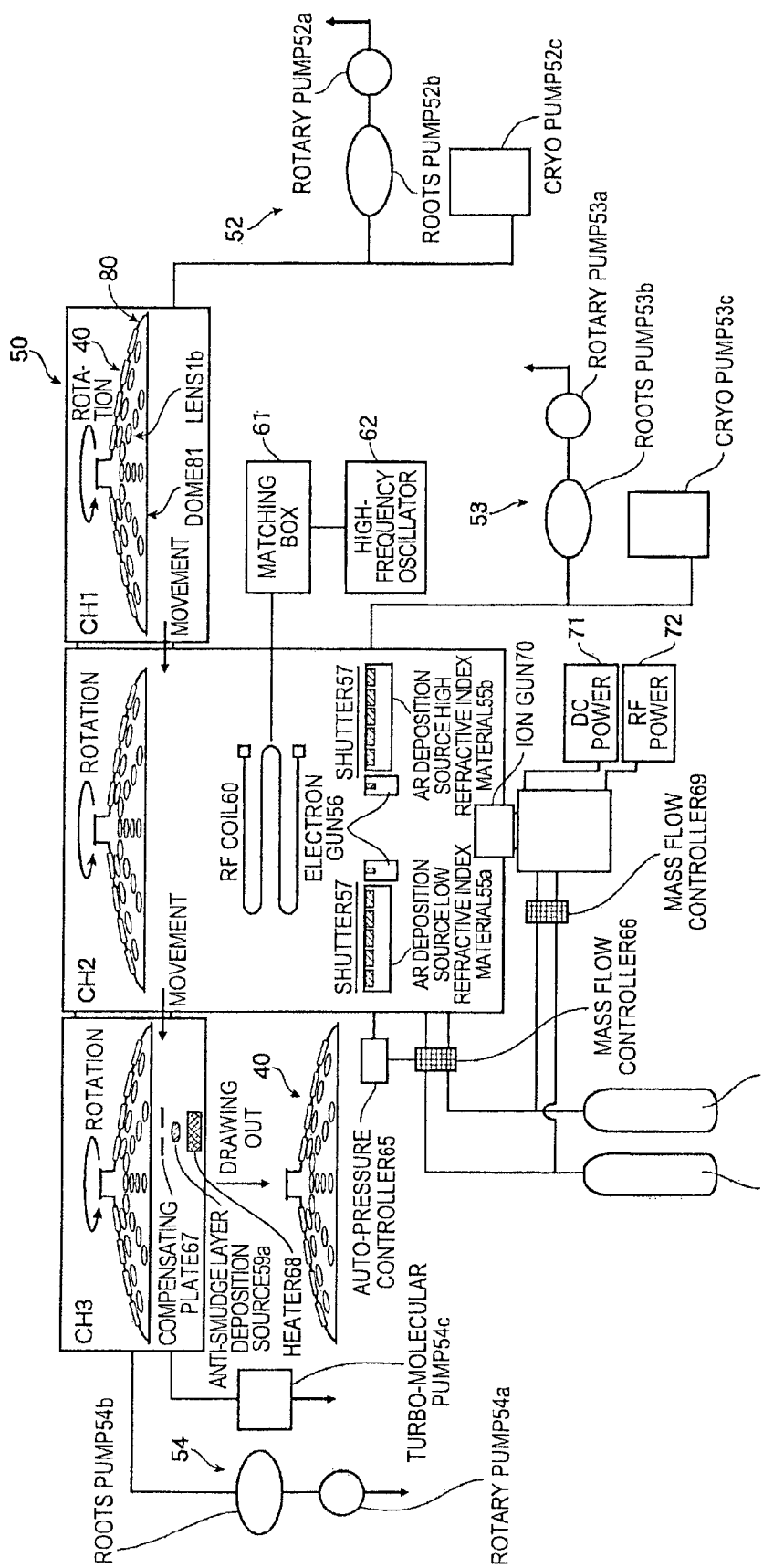
FIG. 5 is a view showing a general configuration of an apparatus for forming an anti-reflection layer and an anti-smudge layer.

FIG. 5 shows a general configuration of a film forming apparatus 50 for forming an anti-reflection layer having a multi-layered structure by vacuum deposition on a surface of a substrate (work) 40 mounted on a supporting apparatus 80.

The film forming apparatus 50 shown in FIG. 5 is different in function of the chamber CH3 from that shown in FIG. 1. In the film forming apparatus 50 shown in FIG. 5, in addition to a function as an exit chamber, the chamber CH3 forms an anti-smudge layer by depositing a fluorine-contained silane compound. Thus, inside the chamber CH3 are provided an anti-smudge layer deposition source 59a in which the fluorine-contained silane compound is immersed, a heater (halogen lamp) 68, and a compensating plate 67 for controlling the discharge amount of the fluorine-contained silane compound by adjusting a degree of opening. The chamber CH3 keeps at an appropriate pressure by a vacuum generating apparatus 54 having a rotary pump 54a, a roots pump 54b and a turbo-molecular pump 54c. The work substrates 40 on the supporting apparatus 80 drawn out of the chamber CH3 are injected into a thermo-hygrostat (not shown) and are annealed at appropriate humidity and temperature. Also, the work substrates 40 are aged when they are left alone in a room for a specified period of time. Other elements and operation are the same as the film forming apparatus 50 of the first embodiment, and therefore, the same reference numerals are denoted by the same elements as the first embodiment, and explanation of which will be omitted.

Figure 6:
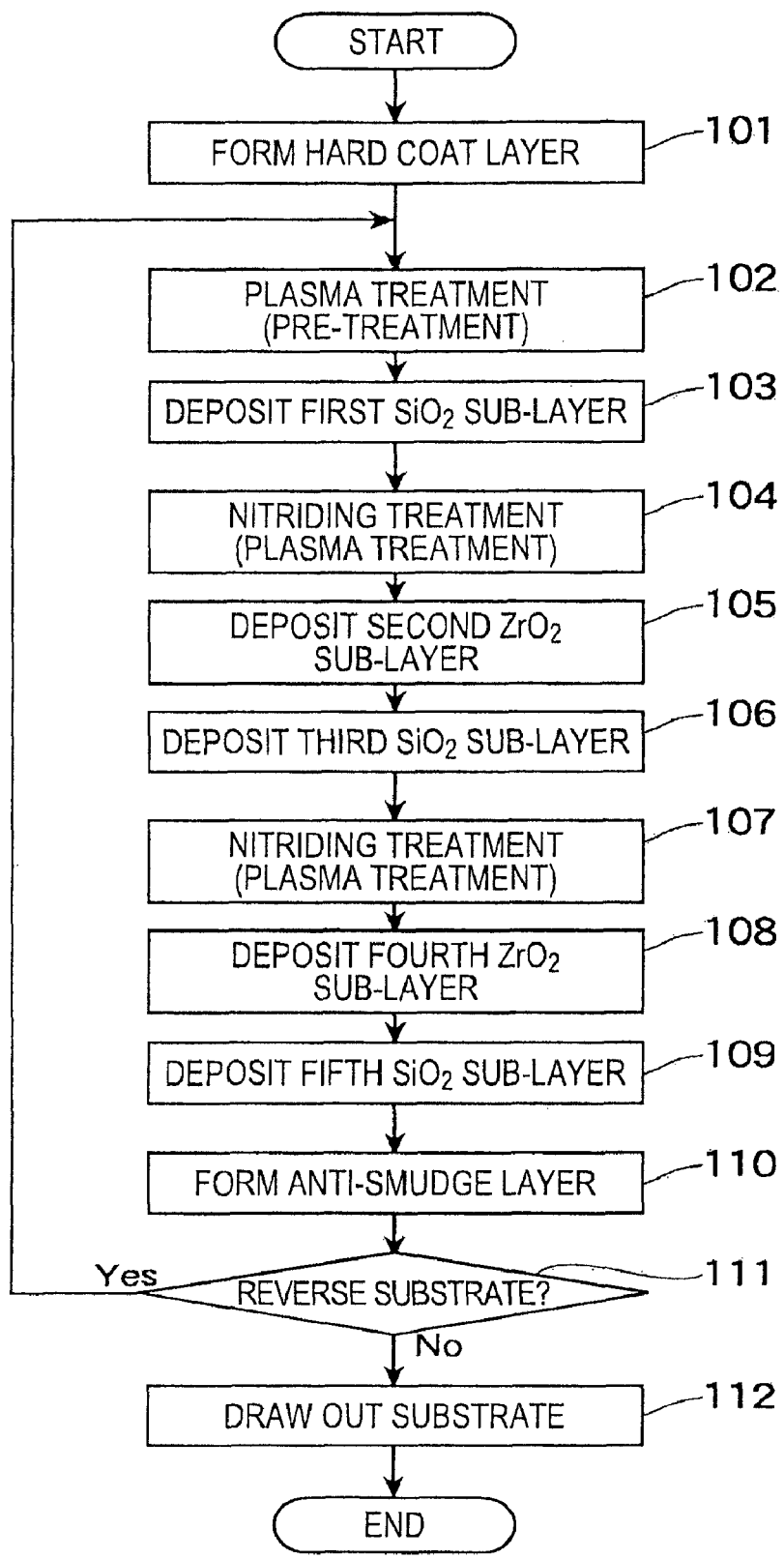
FIG. 6 is a flow chart illustrating a manufacturing method of a lens according to a second embodiment.
Figure 7:
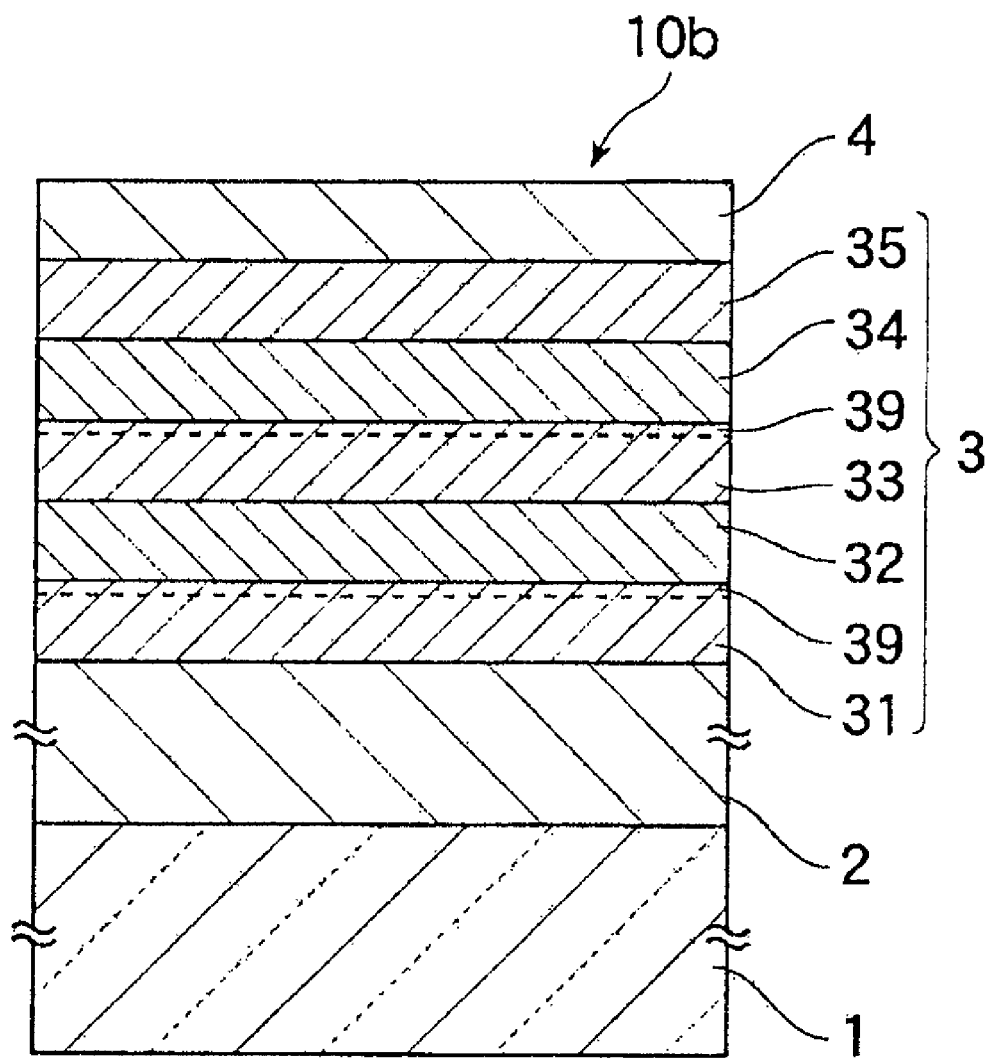
FIG. 7 is an enlarged sectional view of a general structure of an anti-reflection layer and an anti-smudge layer.

FIG. 6 is a flow chart illustrating a process of forming an anti-reflection layer having a multi-layered structure on the work substrate 40 in the film forming apparatus 50. In addition, FIG. 7 shows a section of a film structure of an optical article 10b including an anti-reflection layer 3 and an anti-smudge layer 4. The anti-reflection layer 3 includes, for example, a first sub-layer 31 made of silicon oxide and formed on an optical substrate 1, a second sub-layer 32 made of zirconium oxide, a third sub-layer 33 made of silicon oxide, a fourth sub-layer 34 made of zirconium oxide, and a fifth sub-layer 35 made of silicon oxide.

If the optical substrate 1 is made of plastic, a hard coat layer 2 is formed on the optical substrate 1, prior to the anti-reflection layer 3, at Step 101, as in the manufacturing method shown in FIG. 2.

The optical substrate 1 formed with the hard coat layer 2 is set as the work substrate 40 in the supporting apparatus 80 and is carried into the film forming apparatus 50. In the film forming apparatus 50, the supporting apparatus 80 is first introduced into the chamber CH1 and is degassed, and then is moved to the chamber CH2 for plasma treatment at Step 102. The first sub-layer 31 made of silicon oxide is formed (layer forming process (first process)) at Step 103, and then a surface of the first sub-layer 31 is nitrided by the plasma treatment or the ion gun treatment (nitriding process) at Step 104.

Accordingly a partial layer 39 containing a nitride is partially or entirely formed on the surface (in the opposite side to the optical substrate 1) of the first sub-layer 31 made of silicon oxide. At this time, gas of any composition including nitrogen is used as introduced gas. For example, the introduced gas may include 100% nitrogen, a mixture of nitrogen and oxygen, a mixture of nitrogen and argon, a mixture of nitrogen, oxygen and argon, etc.

The second sub-layer 32 made of zirconium oxide is formed at Step 105, and then the third sub-layer 33 made of silicon oxide is formed (layer forming process (first process)) at Step 106. Then, a surface of the third sub-layer 33 is nitrided (nitriding process) at Step 107, as in Step 104.

The fourth sub-layer 34 made of zirconium oxide is formed at Step 108, and then the fifth sub-layer 35 made of silicon oxide is formed (layer forming process (second process)) at Step 109. The fifth sub-layer 35 becomes the uppermost layer of the anti-reflection layer 3. Accordingly, after the layer forming process (second process), the supporting apparatus 80 is moved to the chamber CH3, and the anti-smudge layer 4 made of the fluorine-contained silane compound is directly formed on the fifth silicon oxide sub-layer 35 at Step 110. Accordingly, the antireflection layer 3 having the five-layered structure and the anti-smudge layer 4 are formed on one side of the optical article. Next, after the work substrate 40 is reversed at Step 111 and then is set in the supporting apparatus 80, Steps 102 to 110 are repeated. When the anti-reflection layer 3 and the anti-smudge layer 4 are formed on both sides of the work substrate 40, the optical substrate 40 is drawn out of the chamber CH3 at Step 112.

Here, the nitriding process may be performed for one or both of two low refractive index sub-layers 31 and 33 except the uppermost sub-layer 35 of the three silicon oxide sub-layers 31, 33 and 35. The uppermost sub-layer 35 is the second low refractive index sub-layer and is not nitrided. Since only an extremely thin surface of the silicon oxide sub-layer is nitrided in the nitriding process, performance of the anti-reflection layer 3 is not nearly affected.

Embodiment 2-1

Hereinafter, several examples of manufacturing a plastic spectacle lens as the optical article according to the manufacturing method shown in FIG. 6 will be described. In the following embodiments and comparative examples, a plastic spectacle lens base material ("Seiko Supper Sovereign" available from Seiko Epson Corporation) is used as the optical substrate 1. At Step 101, the hard coat layer 2 is formed on the both sides of the optical substrate 1. In subsequent Steps, the anti-reflection layer 3 is formed on the work substrate 40 which refers to the optical substrate 1 having the hard coat layer 2 formed on its both sides.

The work substrate 40 is set on the dome 81 of the supporting apparatus 80 whose concave side directs downward, and then is carried into the film forming apparatus 50. At Step 102, after degassing the chamber CH1, 100% argon gas is introduced into the chamber CH2, and the work substrate 40 is treated by plasma generated by a high frequency plasma generating apparatus while keeping a pressure of the gas at $4.0 \times 10^{-2}$ Pa. The plasma treatment is conducted for one minute under conditions of frequency of 13.56 MHz and power of 400 W. This aims at cleaning a surface of the optical substrate 1 in order to improve adhesion between the optical substrate 1 and the anti-reflection layer 3.

Subsequently, Steps 103 to 110 are performed so that the sub-layers 31, 33 and 35 made of $SiO_2$ and the sub-layers 32 and 34 made of $ZrO_2$ are alternately deposited to form the anti-reflection layer 3 comprising these sub-layers. At this time, the film thickness of the first sub-layer ($SiO_2$) 31 is $0.09\lambda$, the film thickness of the second sub-layer ($ZrO_2$) 32 is $0.162$, the film thickness of the third sub-layer ($SiO_2$) 33 is $0.05\lambda$, the film thickness of the fourth sub-layer ($ZrO_2$) 34 is $0.27\lambda$, and the film thickness of the fifth sub-layer ($SiO_2$) 35 is $0.27\lambda$.

The uppermost sub-layer 35 of the anti-reflection layer 3 is a $SiO_2$ layer. Also, the plasma generating apparatus 60 is used for the nitriding process at Steps 104 and 107. For this reason, after the $SiO_2$ layer is deposited, nitrogen gas and oxygen gas are introduced with a ratio of 7:3 into the chamber CH2, and the high frequency plasma generating apparatus generates plasma while keeping a pressure of the gases at $4.0 \times 10^{-2}$ Pa. The plasma treatment is conducted for five minutes under conditions of frequency of 13.56 MHz and power of 600 W. Accordingly, partial layers 39 containing a nitride are formed on surfaces of the first and third $SiO_2$ sub-layers 31 and 33. That is, the first and third sub-layers 31 and 33 become nitrided layers (surface nitrided layers).

Thereafter, the supporting apparatus 80 is moved to the chamber CH3 to form the anti-smudge layer 4 at Step 110. A fluorine-contained organic silicon compound ("KY-130" available from Shin-Etsu Chemical Co., Ltd., indicated by the general formula (2)) is used as the deposition source 59a. Specifically, the deposition source 59a is made by diluting "KY-130" with fluorine-based solvent ("Novec FIFE-7200" available from Sumitomo 3M, Limited) to produce a solution having 3% solid content concentration, and immersing and drying the produced solution of 1 g into pellet made of porous ceramic. The deposition source 59a is set in the chamber CH3. During the film forming, a halogen lamp is used as the heater 68, the pellet of the deposition source 59a is heated to 600° C. to evaporate the fluorine-contained organic silicon compound. Deposition time is three minutes.

After forming the anti-smudge layer 4, the supporting apparatus 80 is drawn out of the chamber, the lens is reversed and set on the dome 81 of the supporting apparatus 80 whose convex side directs downward, and then, the above-described processes are repeated. Accordingly, a plastic lens (sample S2-1) having the anti-reflection layer 3 and the anti-smudge layer 4 is formed on the both sides of the lens, that is, on the opposite side to the optical substrate 1 of the hard coat layer 2. In the sample S2-1, surfaces of the $SiO_2$ sub-layers 31 and 33, as the first low refractive index sub-layer, of the anti-reflection layer 3, that is, surfaces in the opposite side to the optical substrate 1, are nitrided. In addition, the anti-smudge layer 4 is directly formed on the sub-layer 35 as the second low refractive index sub-layer.

Embodiment 2-2

In embodiment 2-2, a plastic lens (sample S2-2) having the anti-reflection layer 3 having the five sub-layers is manufactured according the above-described steps in embodiment 2-1 except Step 107. Accordingly, in the sample S2-2 of embodiment 2-2, only the innermost layer (first sub-layer) 31 of the silicon dioxide sub-layers 31, 33 and 35 included in the anti-reflection layer 3 (that is, the sub-layer 31 of the anti-reflection layer 3 which forms a surface at a side of the optical substrate 1) is nitrided to form the partial layer 39 containing a nitride.

Embodiment 2-3

In embodiment 2-3, a plastic lens (sample S2-3) having the anti-reflection layer 3 having the five sub-layers is manufactured according the above-described steps in embodiment 2-1 except Step 104. Accordingly, in the sample S2-3 of embodiment 2-3, only the third sub-layer 33 of the silicon dioxide sub-layers 31, 33 and 35 included in the anti-reflection layer 3 is nitrided to form the partial layer 39 containing a nitride.

Embodiment 2-4

In embodiment 2-4, Steps 102 to 110 are performed to nitride the silicon dioxide sub-layers 31 and 33 included in the anti-reflection layer 3. In this case, instead of the plasma generating apparatus 60, the ion gun 70 is used for the nitriding process at Steps 104 and 107. Accordingly, the nitrogen gas 64a and the oxygen gas 63 are introduced with a ratio of 7:3 and at a flow of 35 SCCM into the ion gun 70, and then, the ion gun 70 irradiates nitrogen and oxygen ions on the sub-layers 31 and 33. The ion irradiation is conducted for five minutes under conditions of frequency of 13.56 MHz, RF power of 450 W, acceleration voltage of 500 V, and suppressor voltage of 300 V while keeping an internal pressure of the chamber at $4.0 \times 10^{-3}$ Pa. Other processes are the same as embodiment 2-1.

Accordingly, in the sample S2-4 of embodiment 2-4, surfaces of the $SiO_2$ sub-layers 31 and 33, as the first low refractive index sub-layer, of the anti-reflection layer 3, that is, surfaces in the opposite side to the optical substrate 1, are nitrided to form the partial layer 39 containing a nitride. In addition, the anti-smudge layer 4 is directly formed on the sub-layer 35 as the second low refractive index sub-layer.

Embodiment 2-5

In embodiment 2-5, Steps 102 to 110 are performed to nitride the silicon dioxide sub-layers 31 and 33 included in the anti-reflection layer 3, as in embodiment 2-1. A fluorine-contained organic silicon compound ("OPTOOL DSX" available from Daikin Industries, Ltd., indicated by the general formula (1)) is used as the deposition source 59a for forming the anti-smudge layer 4 at Step 110. Specifically, the deposition source 59a is made by diluting "OPTOOL DSX" with fluorine-based solvent ("DEMNAM SOLVENT" available from Daikin Industries, Ltd.) to produce a solution having 3% solid content concentration, and immersing and drying the produced solution of 1 g into pellet made of porous ceramic. The deposition source 59a is set in the chamber C113.

Accordingly, in the sample S2-5 of embodiment 2-5, surfaces of the $SiO_2$ sub-layers 31 and 33, as the first low refractive index sub-layer, of the anti-reflection layer 3, that is, surfaces in the opposite side to the optical substrate 1, are nitrided to form the partial layer 39 containing a nitride. In addition, the anti-smudge layer 4 is directly formed on the sub-layer 35 as the second low refractive index sub-layer.

Embodiment 2-6

In embodiment 2-6, a lens having an anti-reflection layer 3 having seven sub-layers is manufactured. Accordingly, a process of nitriding a fifth silicon dioxide sub-layer, a process of depositing a sixth sub-layer, and a process of depositing a seventh silicon dioxide sub-layer as the outermost sub-layer are further performed. The anti-smudge layer 4 is formed on a surface of the seventh silicon dioxide sub-layer at Step 110. In addition, instead of $ZrO_2$, $TiO_2$ is used to form a high refractive index sub-layer. Other processes are the same as embodiment 2-1. In the process of forming the high refractive index sub-layer, $TiO_2$ is deposited by ion assist deposition. At this time, 100% oxygen gas is introduced at a flow of 35 SCCM into the ion gun 70. Ion irradiation is conducted under conditions of frequency of 13.56 MHz, RF power of 450 W, acceleration voltage of 500 V, and suppressor voltage of 300 V while keeping an internal pressure of the chamber at 4.0× $10^{-3}$ Pa. At this time, the film thickness of the first sub-layer ($SiO_2$) is 0.08%, the film thickness of the second sub-layer ($TiO_2$) is 0.07%, the film thickness of the third sub-layer ($SiO_2$) is 0.10%, the film thickness of the fourth sub-layer ($TiO_2$) is 0.18%, the film thickness of the fifth sub-layer ($SiO_2$) is 0.07λ, the film thickness of the sixth sub-layer ($TiO_2$) is 0.14λ, and the film thickness of the seventh sub-layer ($SiO_2$) is 0.26λ.

Accordingly, in the sample S2-6 of embodiment 2-6, all of the silicon dioxide sub-layers included in the anti-reflection layer 3, except the outermost sub-layer, are nitrided to form the partial layer 39 containing a nitride.

Embodiment 2-7

In embodiment 2-7, according to a manufacturing method of forming the anti-smudge layer 4 after nitriding the sub-layer 35 corresponding to the second low refractive index sub-layer without performing Steps 104 and 107 for nitriding the sub-layers 31 and 33 corresponding to the first low refractive index sub-layer, a plastic lens (sample S2-7) having the same composition as embodiment 2-1, that is, the anti-reflection layer 3 having the five sub-layers including the low refractive index $SiO_2$ sub-layer and the high refractive index $ZrO_2$ sub-layer and the anti-smudge layer 4 is manufactured. Other processes are the same as embodiment 2-1.

Embodiment 2-8

In embodiment 2-8, a plastic lens (sample S2-8) having the same composition as embodiment 2-6, that is, the anti-reflection layer 3 having the seven sub-layers including the low refractive index $SiO_2$ sub-layer and the high refractive index $TiO_2$ sub-layer, with only the uppermost sub-layer of the anti-reflection layer 3 corresponding to the second low refractive index sub-layer nitrided, and the anti-smudge layer 4 formed on the nitrided uppermost sub-layer is manufactured. Other processes are the same as embodiment 2-6.

Comparative Example 2-1

In comparative example 2-1, a plastic lens (sample SR2-1) that is not nitrided and has the same composition as embodiment 2-1, that is, the anti-reflection layer 3 having the five sub-layers including the low refractive index $SiO_2$ sub-layer and the high refractive index $ZrO_2$ sub-layer and the anti-smudge layer 4 is manufactured without performing Steps 104 and 107. Other processes are the same as embodiment 2-1. Accordingly, in the sample SR2-1 of comparative example 2-1, none of the silicon dioxide sub-layers 31, 33 and 35 included in the anti-reflection layer 3 is nitrided.

Comparative Example 2-2

In comparative example 2-2, a plastic lens (sample SR2-2) that is not nitrided and has the same composition as embodiment 2-6, that is, the anti-reflection layer 3 having the seven sub-layers including the low refractive index $SiO_2$ sub-layer and the high refractive index $TiO_2$ sub-layer is manufactured. Other processes are the same as embodiment 2-6. Accordingly, in the sample SR2-2 of comparative example 2-2, none of the silicon dioxide sub-layers included in the anti-reflection layer 3 is nitrided.

Evaluation

Scratch resistance of the samples S2-1 to S2-8 of embodiments 2-1 to 2-8 and the samples SR2-1 and SR2-2 of comparative examples 2-1 and 2-2 and durability of the anti-smudge layer 4 are evaluated according to the following method. Results of the evaluation are listed in FIGS. 8A and 8B.

To evaluate the scratch resistance, a steel wool (#0000) wound on a jig is fifty times reciprocated with load of 2 kg on the outermost surface of the anti-reflection layer 3 of the samples S2-1 to S2-8 and SR2-1 and SR2-2. A level of scratch on the outermost surface is evaluated in four grades of A, B, C and D in comparison with a reference sample. Here, A indicates the best, and B, C and D indicate worse in order.

To evaluate the durability of the anti-smudge layer 4, an acceleration process is performed in which a cotton cloth is 5000 times reciprocated with load of 200 g on a convex surface of the lens. Anti-smudge performance before and after the acceleration process is evaluated with a contact angle and wipeability of oily ink. A contact angle of pure water according to a droplet method is measured using a contact angle meter ("CA-D Type" available from Kyowa Science Co., Ltd.). For the wipeability of oily ink, a straight line of about 4 cm is drawn on the convex surface of the lens using a black oily marker ("High Mackee Care" available from Zebra Co., Ltd.), and the convex surface of the lens is left alone for about 5 minutes. Thereafter, after the black oily marker is wiped using a wiper ("K-Dry" available from Nippon Paper Crecia Co., Ltd.), the wipeability of oily ink is evaluated according to the following criterion.

○: Completely removable by wiping less than 10 times
Δ: Completely removable by wiping 11 to 20 times
x: Completely not removed by wiping more than 20 times An evaluation of a scratch resistance test for the samples S2-1 to S2-8 of embodiments 2-1 to 2-8 in which at least one silicon dioxide sub-layer was nitrided is good (A) or allowable (B). On the other hand, an evaluation of a scratch resistance test for the samples SR2-1 and SR2-2 of comparative examples 2-1 and 2-2, which were not nitrided, is bad (D). As a result, it can be known that the scratch resistance is improved by nitriding at least one of the silicon dioxide sub-layers. In addition, a level of the scratch resistance of the samples of embodiments 2-2 and 2-3 in which only one sub-layer is nitrided is evaluated to be B lower than that of the samples in which all the silicon dioxide sub-layers except the outermost sub-layer are nitrided. However, this grade B is sufficiently acceptable.

The samples S2-1 to S2-6 of embodiments 2-1 to 2-6 and the samples SR2-1 and SR2-2 of comparative examples 2-1 and 2-2 in which the uppermost low refractive index sub-layer of the anti-reflection layer 3 is not nitrided have sufficient durability of the anti-smudge layer, with wipeability unchanged before and after the acceleration process. On the other hand, the samples S2-7 and S2-8 of embodiments 2-7 and 2-8 in which the uppermost low refractive index sub-layer of the anti-reflection layer 3 is nitrided have deteriorated wipeability after the acceleration process although they have sufficient wipeability before the acceleration process. Accordingly, it is understood that durability of the anti-smudge layer 4 can be improved greatly by not nitriding the uppermost low refractive index sub-layer 35 of the anti-reflection layer 3.

Evaluating collectively, the samples S2-1 to S2-8 of the embodiments are all excellent (0) or good (O) as products. The samples SR2-1 and SR2-2 of comparative examples are all disallowable (x). As a result, it can be known that the scratch resistance is improved by nitriding at least one of the silicon dioxide sub-layers. In addition, it can be known that the wipeability can be improved when the uppermost low refractive index sub-layer of the anti-reflection layer 3 is not nitrided.

In addition, the second embodiment relates to an optical article in which the anti-reflection layer and the anti-smudge layer are formed on the plastic spectacle lens having the hard coat layer. In case of an optical article having a glass base material, the anti-reflection layer may be formed on the glass base material without the hard coat layer interposed therebetween. In addition, the optical article is not limited to the spectacle lens, but may include optical products, for example, an optical device of an image displaying apparatus, a prism, an optical fiber, an optical device for an information recording medium, a filter, etc., to which the manufacturing method according to the above-described embodiment can be applied.

Third Embodiment

A first aspect of a third embodiment of the invention relates to a manufacturing method of an optical article having one or more thin films formed on an optical substrate, in which the outermost layer of the thin films has a low refractive index and a surface of the outermost low refractive index layer is nitrided.

According to the first aspect, durability, particularly, scratch resistance, of the thin film can be improved by nitriding the surface of the outermost low refractive index layer formed on the optical substrate.

In a second aspect of the third embodiment of the invention, according to the first aspect, the outermost low refractive index layer is formed by vacuum deposition and then is nitrided by plasma treatment or ion gun treatment using nitrogen-contained gas introduced into a vacuum chamber in which the vacuum deposition is performed.

According to the second aspect, a surface of the outermost low refractive index layer formed on the optical substrate by vacuum deposition can be nitrided through plasma treatment or ion gun treatment using nitrogen-contained gas introduced into the vacuum chamber in which the vacuum deposition is performed. Accordingly, durability, particularly, scratch resistance, of the thin film can be improved.

In a third aspect of the third embodiment of the invention, according to the first or second aspect, the outermost low refractive index layer includes silicon dioxide as a main component.

According to the third aspect, durability, particularly, scratch resistance, of the optical article can be improved by nitriding the outermost low refractive index layer having silicon dioxide as the main component.

A fourth aspect of the third embodiment of the invention relates to an optical article having one or more thin films formed on an optical substrate, in which the outermost layer of the thin films has a low refractive index and the outermost low refractive index layer includes a partial layer that contains nitrogen and is formed in the opposite side to the optical substrate. The partial layer described herein refers to a surface layer of the outermost low refractive index layer. The fourth aspect relates to nitriding the surface layer of the outermost low refractive index layer.

According to the fourth aspect, since the partial layer that contains nitrogen is formed on the surface of the outermost low refractive index layer, durability, particularly, scratch resistance, of the optical article can be improved.

In a fifth aspect of the third embodiment of the invention, according to the fourth aspect, the outermost low refractive index layer includes silicon dioxide as a main component.

According to the fifth aspect, durability, particularly, scratch resistance, of the optical article can be improved by nitriding the outermost low refractive index layer having silicon dioxide as the main component.

In the third embodiment, the partial layer that contains nitrogen is formed by entirely or partially nitriding the surface of the low refraction sub-layer made of silicon dioxide or the like. Accordingly, the scratch resistance of the surface of the anti-reflection layer which is susceptible to scratch can be improved. In this case, the partial layer contains $Si_sO_tN_u$ (where, s and u are a positive integral number, and t is an integral number more than 0).

In the above-described manufacturing method, when gas containing nitrogen is introduced into a vacuum chamber and plasma treatment or ion gun treatment is performed using the introduced gas, the surface of the low refractive index sub-layer made of silicon dioxide or the like can be partially or entirely nitrided. Accordingly, there is no need to control a film thickness strictly to introduce a nitrided layer. In addition, without precise control of time to control ion current, the nitride layer may be easily introduced, thereby improving the scratch resistance of the anti-reflection layer. Particularly, in the plasma treatment, there is no need of an ion source, and silicon nitride can be simply introduced in a vacuum deposition apparatus or during deposition.

The low refractive index sub-layer made of silicon dioxide or the like may form a portion of functional thin films, for example, a portion of the anti-reflection layer. In case of silicon dioxide, since $SiO_2$ and $Si_sO_tN_u$ (where, s and u are a positive integral number, and t is an integral number more than 0) are mixed together in the formed partial layer, a refractive index of the partial layer falls within a range of 1.45 to 2.05. However, the thickness or area of the partial layer is limited, a film design for the anti-reflection layer is not nearly affected.

In the anti-smudge layer may be formed on the uppermost layer of a functional thin film. In this case, it is preferable to form a different low refractive index sub-layer again on the partial layer, which contains nitrogen, of the low refractive index sub-layer. Accordingly, since silicon oxide of the uppermost layer on which the anti-smudge layer is stacked is not nitrided, it is possible to improve the scratch resistance while maintaining the durability of the anti-smudge layer.

A fluorine-containing silane compound is appropriate for the composition of the anti-smudge layer. One example of the fluorine-containing silane compound appropriate for the anti-smudge layer is one indicated by the above general formula (1).

Another example of the fluorine-containing silane compound appropriate for the anti-smudge layer is one indicated by the above general formula (2).

Figure 9:
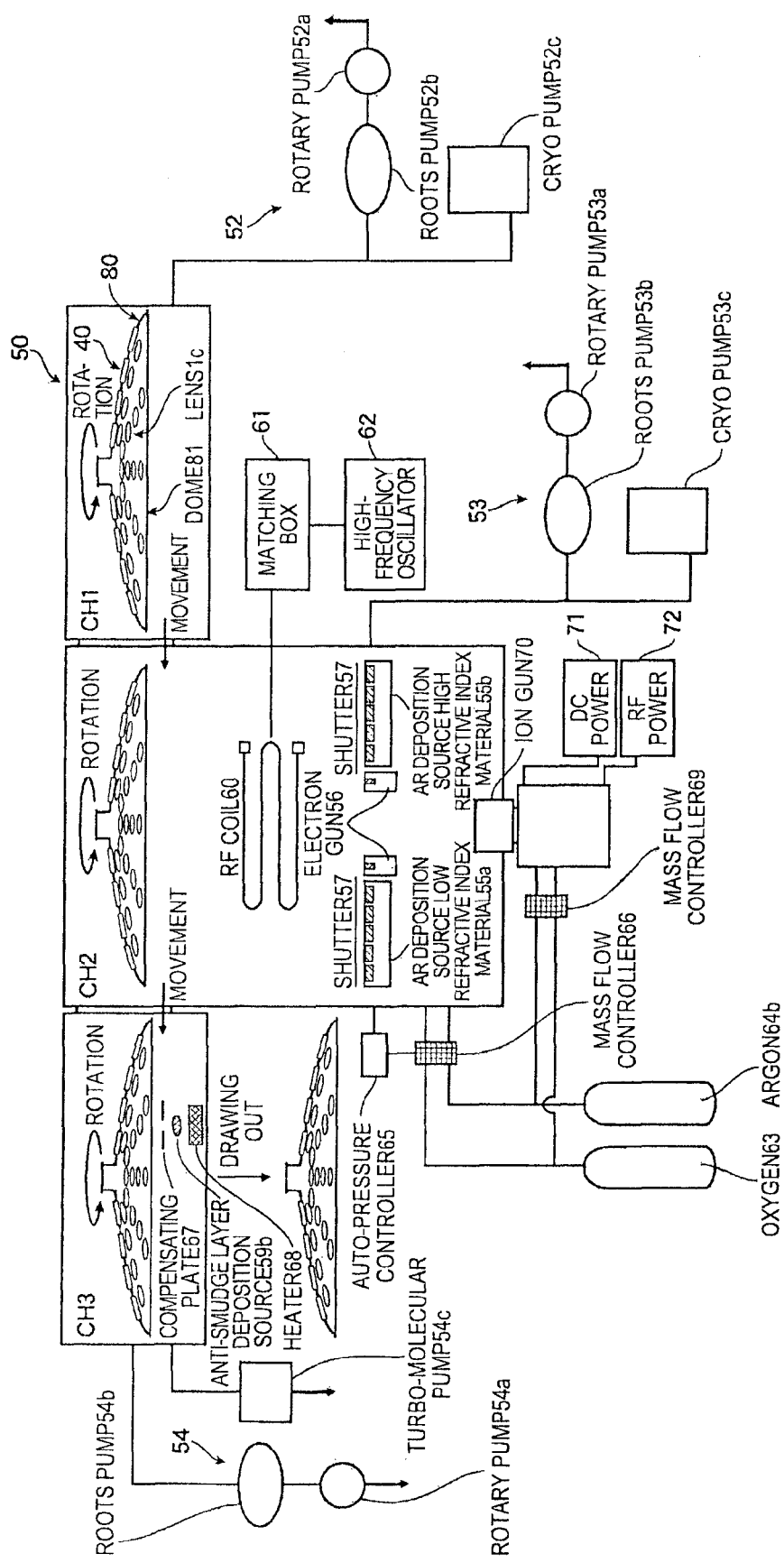
FIG. 9 is a view showing a general configuration of an apparatus for forming a functional thin film and an anti-smudge layer.

FIG. 9 shows a general configuration of a film forming apparatus 50 for forming various kinds of functional thin films on a surface of a substrate (work) 40 mounted on a supporting apparatus 80 by vacuum deposition. The supporting apparatus 80 is as shown in FIG. 1. The film forming apparatus 50 has three chambers CH1, CH2 and CH3 through which the supporting apparatus 80 passes. The chambers CH1 to CH3 can be separately sealed up, and internal pressure of the chambers CH1 to CH3 is controlled by vacuum generating apparatuses 52, 53 and 54, respectively. The chamber CH1 is an entrance or gate chamber. The chamber CH2 is a second chamber for forming various kinds of functional thin films. In addition, a mass flow controller 66 for controlling a chamber atmosphere is connected to the chamber CH2. An oxygen gas supply source 63, an argon gas supply source 64b, and a nitrogen gas supply source (not shown) are connected to the mass flow controller 66. The mass flow controller can control the atmosphere of the chamber CH2 to be in 100% oxygen gas, argon gas or nitrogen gas, or a proper mixture thereof.

The chamber CH3 is a chamber for forming an anti-smudge layer by depositing a fluorine-contained silane compound. Thus, inside the chamber CH3 are provided an anti-smudge layer deposition source 59b in which the fluorine-contained silane compound is immersed, a heater (halogen lamp) 68, and a compensating plate 67 for controlling the discharge amount of the fluorine-contained silane compound by adjusting a degree of opening. The chamber CH3 keeps at an appropriate pressure by a vacuum generating apparatus 54 having a rotary pump 54a, a roots pump 54b and a turbo-molecular pump 54c. The work substrates 40 on the supporting apparatus 80 drawn out of the chamber CH3 are injected into a thermo-hygrostat (not shown) and are annealed at appropriate humidity and temperature when the anti-smudge layer is formed. Also, the work substrates 40 are aged when they are left alone in a room for a specified period of time. If the anti-smudge layer is not formed in the chamber CH3, annealing and aging are unnecessary. Other elements and operation are the same as the film forming apparatus 50 shown in FIG. 1, and therefore, the same reference numerals are denoted by the same elements as the first embodiment, and explanation of which will be omitted.

Figure 10:
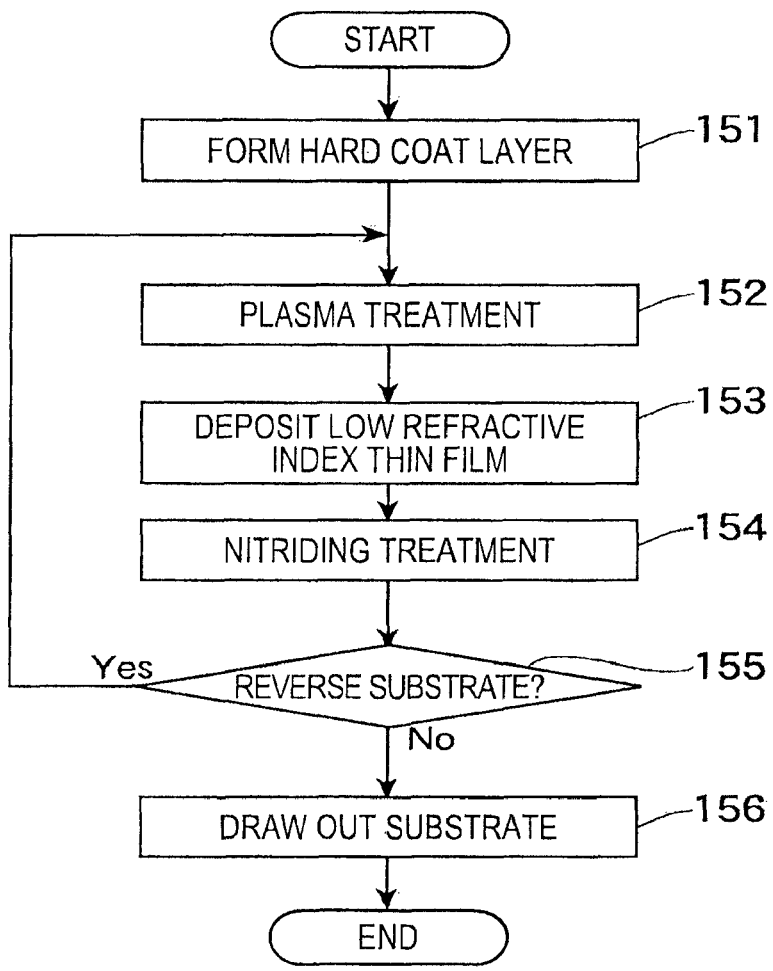
FIG. 10 is a flow chart illustrating a manufacturing method of a lens according to a third embodiment.
Figure 11:
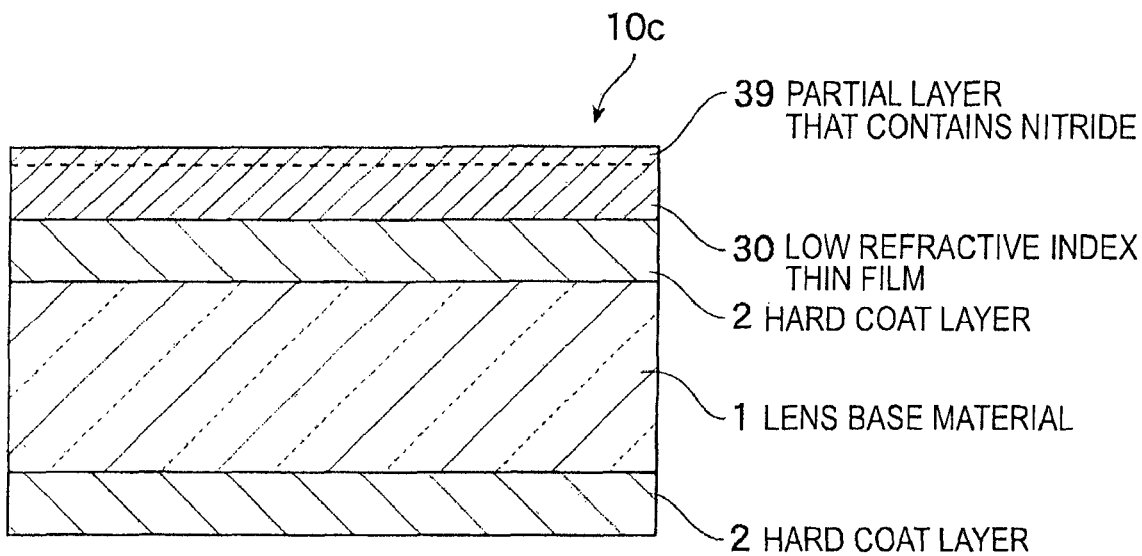
FIG. 11 is an enlarged sectional view of a general structure of a functional thin film.

FIG. 10 shows a flow chart illustrating a process of forming a single-layered low refractive index thin film as an example of a process of forming a functional thin film on the work substrate 40 in the film forming apparatus 50. In addition, FIG. 11 shows a section of a film structure of an optical article 10c.

If the optical substrate 1 is made of plastic, a hard coat layer 2 is formed on the optical substrate 1, prior to a low refractive index thin film 30, at Step 151, as in the above embodiment.

The optical substrate 1 formed with the hard coat layer 2 is set as the work substrate 40 in the supporting apparatus 80 and is carried into the film forming apparatus 50. In the film forming apparatus 50, the supporting apparatus 80 is first introduced into the chamber CH1 and is degassed, and then is moved to the chamber CH2 for plasma treatment at Step 152. This aims at cleaning a surface of the optical substrate 1 in order to improve adhesion between the hard coat layer 2 on the optical substrate 1 and the low refractive index thin film 30.

A silicon dioxide thin film is formed as the low refractive index thin film at Step 153, and then a surface of the silicon dioxide thin film 30 is nitrided by the plasma treatment or the ion gun treatment at Step 154. Accordingly, a partial layer 39 containing a nitride is partially or entirely formed on the surface (in the opposite side to the optical substrate 1) of the silicon dioxide thin film 30. That is, the silicon dioxide thin film 30 becomes a layer including a nitrided portion (surface nitrided layer). At this time, gas of any composition including nitrogen is used as introduced gas. For example, the introduced gas may include 100% nitrogen, a mixture of nitrogen and oxygen, a mixture of nitrogen and argon, a mixture of nitrogen, oxygen and argon, etc.

Accordingly, a functional thin film is formed on one side of the optical article. Next, after the work substrate 40 is reversed at Step 155 and then is set in the supporting apparatus 80, Steps 152 to 154 are repeated. When the functional thin film is formed on both sides of the work substrate 40, the optical substrate 40 is drawn out of the chamber CH3 at Step 156.

Embodiment 3-1

Hereinafter, several examples of manufacturing a plastic spectacle lens as the optical article according to the manufacturing method shown in FIG. 10 will be described. In the following embodiments and comparative examples, a plastic spectacle lens base material ("Seiko Supper Sovereign" available from Seiko Epson Corporation) is used as the optical substrate 1. At Step 151, the hard coat layer 2 is formed on the both sides of the work substrate 40. In subsequent Steps, the low refractive index thin film 30 is formed on the work substrate 40.

The work substrate 40 is set on the dome 81 of the supporting apparatus 80 whose concave side directs downward, and then is carried into the film forming apparatus 50. After degassing the chamber CH1, 100% argon gas is introduced into the chamber CH2 at Step 152, and the work substrate 40 is treated by plasma generated by a high frequency plasma generating apparatus while keeping a pressure of the gas at $4.0 \times 10^{-2}$ Pa. The plasma treatment is conducted for one minute under conditions of frequency of 13.56 MHz and power of 400 W. This aims at cleaning a surface of the optical substrate 1 in order to improve adhesion between the optical substrate 1 and the low refractive index thin film 30.

Subsequently, Step 153 is performed to deposit the silicon dioxide thin film 30. Thickness of the silicon dioxide thin film 30 is 90 nm, which shows good performance as a hard anti-reflection film.

The plasma generating apparatus 60 is used for the nitriding process at Step 154. For this reason, after the silicon dioxide thin film is deposited, nitrogen gas and oxygen gas are introduced with a ratio of 7:3 into the chamber CH2, and the high frequency plasma generating apparatus generates plasma while keeping a pressure of the gases at $4.0 \times 10^{-2}$ Pa. The plasma treatment is conducted for five minutes under conditions of frequency of 13.56 MHz and power of 600 W. Accordingly, the partial layer 39 containing a nitride is formed on the surface of the silicon dioxide thin film 30.

Thereafter, the supporting apparatus 80 is drawn out of the chamber CH3, the lens is reversed and set on the dome 81 of the supporting apparatus 80 whose convex side directs downward, and then, the above-described processes are repeated (sample S3-1).

Embodiment 3-2

In embodiment 3-2, a silicon dioxide thin film is deposited after nitriding in embodiment 3-1. This is effective when an anti-smudge layer is formed on the nitrided silicon dioxide thin film serving as a base layer (preparation layer) of the anti-smudge layer. If thickness of the silicon dioxide thin film (base layer) is at least 5 nm, the anti-smudge layer shows good durability.

Thereafter, the supporting apparatus 80 is moved to the chamber CH3 to form the anti-smudge layer. A fluorine-contained organic silicon compound ("KY-130" available from Shin-Etsu Chemical Co., Ltd., indicated by the general formula (2)) is used as a deposition source 59b. Specifically, the deposition source 59b is made by diluting "KY-130" with fluorine-based solvent ("Novec FIFE-7200" available from Sumitomo 3M, Limited) to produce a solution having 3% solid content concentration, and immersing and drying the produced solution of 1 g into pellet made of porous ceramic.

The deposition source 59b is set in the chamber CH3. During the film forming, a halogen lamp is used as the heater 68, the pellet of the deposition source 59b is heated to 600° C. to evaporate the fluorine-contained organic silicon compound. Deposition time is three minutes.

Thereafter, the supporting apparatus 80 is drawn out of the chamber CH3, the lens is reversed and set on the dome 81 of the supporting apparatus 80 whose convex side directs downward, and then, the above-described processes are repeated (sample S3-2).

Comparative Example 3-1

In comparative example 3-1, a plastic lens (sample SR3-1) that is not nitrided in embodiment 3-1 is manufactured.

Comparative Example 3-2

In comparative example 3-2, a plastic lens (sample SR3-2) that is not nitrided in embodiment 3-2 is manufactured.

Evaluation

Scratch resistance of the samples S3-1 and S3-2 of embodiments 3-1 and 3-2 and the samples SR3-1 and SR3-2 of comparative examples 3-1 and 3-2 is evaluated according to the following method. A result of the evaluation is listed in FIG. 12.

To evaluate the scratch resistance, a steel wool (#0000) wound on a jig is fifty times reciprocated with load of 2 kg on the outermost surfaces of the samples S3-1, S3-2, SR3-1 and SR3-2. A level of scratch on the outermost surfaces is evaluated in four grades of A, B, C and D in comparison with a reference sample. Here, A indicates the best, and B, C and D indicate worse in order.

An evaluation of a scratch resistance test for the samples S3-1 and S3-2 of embodiments 3-1 and 3-2 in which the silicon dioxide thin film was nitrided is good (A). On the other hand, an evaluation of a scratch resistance test for the samples SR3-1 and SR3-2 of comparative examples 3-1 and 3-2, which were not nitrided, is bad (D). As a result, it can be known that the scratch resistance is improved by nitriding the silicon dioxide thin film.

Evaluating collectively, the samples S3-1 and S3-2 of the embodiments are all excellent (⊙)) as products, and the samples SR3-1 and SR3-2 of comparative examples are all disallowable (x).

In addition, the third embodiment relates to an optical article in which the functional thin film is formed on the plastic spectacle lens having the hard coat layer. In case of an optical article having a glass base material, the anti-reflection layer may be formed on the glass base material without the hard coat layer interposed therebetween. The third embodiment relates to forming a nitrided silicon dioxide thin film on the outermost layer, however, the same effect as the third embodiment can be obtained even when a multi-layered thin film having an anti-reflection function addition is formed on the outermost layer. In addition, the optical article is not limited to the spectacle lens, but may include optical products, for example, an optical device of an image displaying apparatus, a prism, an optical fiber, an optical device for an information recording medium, a filter, etc., to which the manufacturing method according to the above-described embodiment can be applied.

What is claimed is:

1. A plastic spectacle lens comprising a layer that has $SiO_x$ as a main component and is formed on an optical substrate, directly or with at least one different layer interposed between the layer and the optical substrate, a surface of the layer, which is in the opposite side to the optical substrate, being nitrided, where x>0;
   wherein a part of the layer that is nitrided is thinner than a rest of the layer; and
   wherein the surface that is nitrided includes nitrogen and silicon;
   wherein:
   the layer comprises an anti-reflection layer formed on the optical substrate, directly or with at least one different layer interposed between the anti-reflection layer and the optical substrate, and
   the anti-reflection layer includes a plurality of sub-layers, and at least the outermost sub-layer of the plurality of sub-layers includes the nitrided surface.

2. The plastic spectacle lens according to claim 1, wherein the nitrided surface has a composition of $Si_sO_tN_u$, where, s>0, t≧0, and u>0.

3. The plastic spectacle lens according to claim 1, wherein:
   the optical article layer further comprises an anti-smudge layer directly formed on the antireflection layer, and
   at least one of the plurality of sub-layers, except the outermost sub-layer of the anti-reflection layer, includes the nitrided surface.

4. The plastic spectacle lens according to claim 3, wherein the anti-reflection layer includes a plurality of low refractive index sub-layers and at least one high refractive index sub-layer interposed between the plurality of low refractive index sub-layers, one of the plurality of low refractive index sub-layers is the outermost sub-layer, and at least one of the plurality of low refractive index sub-layers includes the nitrided surface.

5. The plastic spectacle lens according to claim 1, wherein:
   the part of the layer that is nitrided is a thin surface such that performance of the anti-reflection layer is substantially unaffected by the part of the layer that is nitrided.

* * * * *